(12) United States Patent
Jung et al.

(10) Patent No.: US 10,505,395 B2
(45) Date of Patent: Dec. 10, 2019

(54) RESONATOR AND RESONATING METHOD

(71) Applicant: SAMSUNG ELECTRONICS CO., LTD., Suwon-si (KR)

(72) Inventors: Seungchul Jung, Yongin-si (KR); Jongpal Kim, Seoul (KR); Wonseok Lee, Gwangju-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 323 days.

(21) Appl. No.: 15/349,710

(22) Filed: Nov. 11, 2016

(65) Prior Publication Data
US 2017/0149289 A1 May 25, 2017

(30) Foreign Application Priority Data

Nov. 20, 2015 (KR) ........................ 10-2015-0163483

(51) Int. Cl.
| | | |
|---|---|---|
| H01F 27/42 | (2006.01) | |
| H01F 37/00 | (2006.01) | |
| H01F 38/00 | (2006.01) | |
| H02J 50/12 | (2016.01) | |
| H03B 5/12 | (2006.01) | |
| H03H 7/32 | (2006.01) | |
| H03H 19/00 | (2006.01) | |

(Continued)

(52) U.S. Cl.
CPC ............ *H02J 50/12* (2016.02); *H03B 5/1265* (2013.01); *H03B 5/1268* (2013.01); *H03H 7/325* (2013.01); *H03H 19/008* (2013.01); *H04B 5/0037* (2013.01); *H03H 1/02* (2013.01); *H03H 2210/01* (2013.01); *H03H 2210/043* (2013.01)

(58) Field of Classification Search
CPC ..... H02J 50/12; H04B 5/0037; H03H 19/008; H03H 7/325; H03H 2210/01; H03H 2210/043; H03H 1/02; H03B 5/1268; H03B 5/1265
USPC .......... 331/34, 117 R, 117 FE, 167; 307/104
See application file for complete search history.

(56) References Cited

U.S. PATENT DOCUMENTS

2003/0214241 A1* 11/2003 Lee ...................... G09G 3/2965
  315/169.2
2007/0109708 A1  5/2007 Hussman et al.
(Continued)

FOREIGN PATENT DOCUMENTS

KR  10-0824042 B1  4/2008
KR  10-0877688 B1  1/2009
(Continued)

OTHER PUBLICATIONS

Author: Koosuke Harada; Title: Controlled Resonant Converters With Switching Frequency Fixed; Date: Jun. 21, 1987; Publisher: IEEE; pp. 431-438.*

(Continued)

*Primary Examiner* — Richard Tan
(74) *Attorney, Agent, or Firm* — NSIP Law

(57) ABSTRACT

A resonator and resonator method are provided. The resonator includes an inductor, a capacitor, and a switch configured to maintain energy in at least one of the inductor and the capacitor for a select period of time and to enable variability of energy in the at least one of the inductor and the capacitor for another period of time, to set a resonating frequency of the inductor and the capacitor.

34 Claims, 16 Drawing Sheets

(51) Int. Cl.
  *H04B 5/00* (2006.01)
  *H03H 1/02* (2006.01)

(56) References Cited

U.S. PATENT DOCUMENTS

| | | | |
|---|---|---|---|
| 2009/0160261 A1* | 6/2009 | Elo | H02J 5/005 |
| | | | 307/104 |
| 2009/0284220 A1 | 11/2009 | Toncich et al. | |
| 2010/0213770 A1 | 8/2010 | Kikuchi | |
| 2011/0148215 A1 | 6/2011 | Marzetta et al. | |
| 2011/0242856 A1 | 10/2011 | Halberstadt | |
| 2012/0169132 A1 | 7/2012 | Choudhary et al. | |
| 2012/0169134 A1 | 7/2012 | Choudhary et al. | |
| 2012/0313449 A1 | 12/2012 | Kurs et al. | |
| 2013/0234531 A1* | 9/2013 | Budgett | H04B 5/0075 |
| | | | 307/104 |
| 2014/0184152 A1 | 7/2014 | Van Der Lee et al. | |
| 2014/0191818 A1 | 7/2014 | Waffenschmidt et al. | |
| 2015/0084429 A1 | 3/2015 | Bourilkov et al. | |
| 2015/0372494 A1* | 12/2015 | Wakabayashi | H02J 5/005 |
| | | | 307/104 |

FOREIGN PATENT DOCUMENTS

| | | |
|---|---|---|
| KR | 10-2010-0052369 A | 5/2010 |
| WO | WO 2014/125392 A1 | 8/2014 |

OTHER PUBLICATIONS

Hyung-Min Lee et al., "A Power-Efficient Switched-Capacitor Stimulating System for Electrical/Optical Deep Brain Stimulation", IEEE Journal of Solid-State Circuits, vol. 50, No. 1, Jan. 2015 (15 pages, in English).

Xing Li et al., "A 13.56 MHz Wireless Power Transfer System With Reconfigurable Resonant Regulating Rectifier and Wireless Power Control for Implantable Medical Devices", 2014 Symposium on VLSI Circuits Digest of Technical Papers (2014) (2 pages, in English).

Extended European Search Report dated Jul. 28, 2017 in Counterpart European Application No. 16198887.8 (9 pages in English).

European Office Action dated Nov. 21, 2018 in European Patent Application No. 16198887.8 (10 pages in English).

* cited by examiner

100

100

100

100

100

100

100

100

100

100

RESONATOR AND RESONATING METHOD

CROSS-REFERENCE TO RELATED APPLICATION(S)

This application claims the benefit under 35 USC 119(a) of Korean Patent Application No. 10-2015-0163483, filed on Nov. 20, 2015, in the Korean Intellectual Property Office, the entire disclosure of which is incorporated herein by reference for all purposes.

BACKGROUND

1. Field

The following description relates to a resonator and a resonating method.

2. Description of Related Art

LC resonators are frequently used in a wireless power transmission field. A resonant frequency of an LC resonator is determined and fixed based on an inductance of an inductor and a capacitance of a capacitor.

An initially set resonant frequency varies (or drifts) due to various factors between a transmission end (transmitter) and a reception end (receiver). Accordingly, to properly tune the resonant frequency for each situation, the transmission end or the reception end needs to calibrate the resonant frequency. In addition, in the wireless power transmission field, to transmit power through resonance matching it may be necessary to adjust the resonance for either of the transmission end or the reception end.

A typical frequency calibration approach includes directly or indirectly changing the effective value of at least one of an individual inductor and capacitor used in the corresponding resonator. For example, the inductor of the resonator may be a long coil where initially only an intermediate portion of the long coil is used to generate the resonance. When a resonant frequency of the resonator needs to be changed, the inductance is adjusted by changing the extent of the long coil used as the intermediate portion. In the same manner, to have different capacitor values available, a capacitor having several values must be available, or multiple different capacitors of different values must be available. The different capacitances would be switched in or out of the resonance circuit, similar to the adjusting of the extent of the inductor coil that is used.

In other words, to calibrate a frequency in a typical LC resonator, a resonant frequency is changed using one or more inductors and capacitors that can be selectively switched into the resonance circuit to obtain the desired resonant frequency. The changing of the resonant frequency indicates selecting of a desired resonant frequency from discontinuous resonant frequencies. Thus, to have the capability to select various resonant frequencies, the number of required devices, for example, respective switched in devices increases proportionally with the desired various available resonant frequencies.

SUMMARY

This Summary is provided to introduce a selection of concepts in a simplified form that are further described below in the Detailed Description. This Summary may be not intended to identify key features or essential features of the claimed subject matter, nor is it intended to be used as an aid in determining the scope of the claimed subject matter.

One or more embodiments include a resonator that includes an inductor, a capacitor, and a switch configured to maintain energy in at least one of the inductor and the capacitor for a select period of time and to enable variability of energy in the at least one of the inductor and the capacitor for another period of time, to set a resonating frequency of the inductor and the capacitor.

The select period of time may be selected from among varying periods of time, which the switch is configured to maintain energy in the at least one of the inductor and the capacitor, that variably implement respective resonating frequencies of the inductor and the capacitor.

The switch may selectively operate according to the select period of time and the other period of time based upon a control signal from a controller, such that the control signal from the controller implementing the select period of time represents that the select period of time, selected from among the varying periods of time, has been determined by the controller to be a period of time that maximizes a resonance matching of an LC circuit, which includes the inductor and the capacitor, of the resonator and another LC circuit of an exterior resonator that is implementing a wireless power transfer operation between the other LC circuit and the LC circuit of the resonator.

The resonator may be a mobile electronic device and further include the controller, where the switch may be a backscattering switch of the LC circuit of the resonator.

The capacitor may have a fixed capacitance and the inductor may have a fixed inductance, where the capacitor and inductor may be configured to generate plural resonating frequencies depending on which of the varying periods of time is the select period of time.

The switch may operate for a first period of time to perform a calibrating maintenance of energy in the at least one of the inductor and the capacitor and a second period of time to not perform the calibrating maintenance of the energy in a second period of time, in response to a control signal provided by a controller that generates the control signal to calibrate the set resonating frequency.

The switch may be connected in parallel with the inductor.

The switch may be connected in series with the capacitor.

The inductor and the capacitor may be connected in parallel.

The inductor and the capacitor may be connected in series.

The switch may be a first switch connected in parallel with the inductor and configured to maintain an energy in the inductor for a first select period of time, and the resonator may further include a second switch connected in series with the capacitor and configured to maintain an energy in the capacitor for a second select period of time.

The first select period of time may be synchronous with the second select period of time, and the first and second switches may be controlled to operate so that during the first switch being controlled open the second switch is closed and during the first switch being controlled closed the second switch is open.

The capacitor may be a parasitic capacitor of the inductor.

An LC circuit, which includes the inductor, of the resonator that generates the set resonance frequency may generate the set resonance frequency without an additional capacitor.

The resonator may further include a controller configured to control the switch to set the resonating frequency based on energy characteristics of the at least one of the inductor and the capacitor.

The controller may be configured to sense values representing the energy characteristics of the at least one of the inductor and the capacitor while changing operating time extents of the switch from a first operating time extent to a second operating time extent, and may be configured to control operation of the switch, to set the resonating frequency, based on a determined operating time extent for the switch that corresponds to a maximum value among the sensed values.

The controller may be configured to sense values representing the energy characteristics of the at least one of the inductor and the capacitor while incrementally changing operating time extents of the switch up to a predetermined number of times, and may be configured to control operation of the switch, to set the resonating frequency, based on a determined operating time extent for the switch that corresponds to a maximum value among the sensed values.

The energy characteristics of the at least one of the inductor and the capacitor may include at least one of a value for a sensed current of the inductor and a value of a sensed voltage for the capacitor.

One or more embodiments may include a resonator method, the method including controlling operation of a resonator, to set a resonating frequency of an inductor and a capacitor of the resonator, between at least a maintaining of energy in at least one of the inductor and the capacitor for a select period of time and an enabling of variability of energy in the at least one of the inductor and the capacitor for another period of time.

The controlling of the operation of the resonator between the maintaining of energy and enabling of variability of energy may include respectively implementing the maintaining of energy and the enabling of variability of energy through alternate operations of a switch of the resonator.

The method may further include sensing energy characteristics of the at least one of an inductor and a capacitor, and the controlling may further include setting the resonating frequency based on the sensed energy characteristics.

The sensing may include sensing values representing the energy characteristics of the at least one of the inductor and the capacitor while changing operating time extents of the switch from a first operating time extent to a second operating time extent, and the controlling may include controlling the switch, to set the resonating frequency, based on a determined operating time extent, of the changed operating time extents, that corresponds to a maximum value among the sensed values.

The sensing may include sensing values representing the energy characteristics of the at least one of the inductor and the capacitor while incrementally changing operating time extents of the switch up to a predetermined number of times, and the controlling may include controlling the switch, to set the resonating frequency, based on a determined operating time extent, of the changed operating time extents, that corresponds to a maximum value among the sensed values.

The sensed energy characteristics of the at least one of the inductor and the capacitor may include at least one of a value of a sensed current for the inductor and a value of a sensed voltage for the capacitor.

The controlling of the operation of the resonator to set the resonating frequency may be based on the switch being connected in parallel with the inductor.

The controlling of the operation of the resonator to set the resonating frequency may be based on the switch being connected in series with the capacitor.

The controlling of the operation of the resonator to set the resonating frequency may be based on the inductor and the capacitor being connected in parallel.

The controlling of the operation of the resonator to set the resonating frequency may be based on the inductor and the capacitor being connected in series.

The controlling of the operation of the resonator to set the resonating frequency may include controlling a first switch connected in parallel with the inductor and to maintain an energy in the inductor for a first select period of time, and controlling a second switch connected in series with the capacitor and to maintain an energy in the capacitor for a second select period of time.

The controlling of the operation of the resonator to set the resonating frequency may be based on the capacitor being a parasitic capacitor of the inductor.

One or more embodiments include a non-transitory processor readable medium including processor readable code to control one or more processing devices to implement any or any combination of the methods described herein.

One or more embodiments provide a resonator including an LC circuit having a fixed inductance and capacitance, and a resonating frequency controlling circuit configured to selectively maintain energy without change in a portion of the LC circuit for various select periods of time to set respective resonating frequencies of the LC circuit.

The LC circuit may include an inductor with the fixed inductance and a capacitor with the fixed capacitance.

The LC circuit may include3 an inductor with the fixed inductance and the fixed capacitance.

The resonating frequency controlling circuit may include a controller configured to determine a calibrated period of time, from the various select periods of time, to set a calibrated frequency of the LC circuit with a maximum energy level in the LC circuit compared to energy levels that would be provided by remaining select periods of time of the various select periods of time.

Other features and aspects will be apparent from the following detailed description, the drawings, and the claims.

Figure 1:
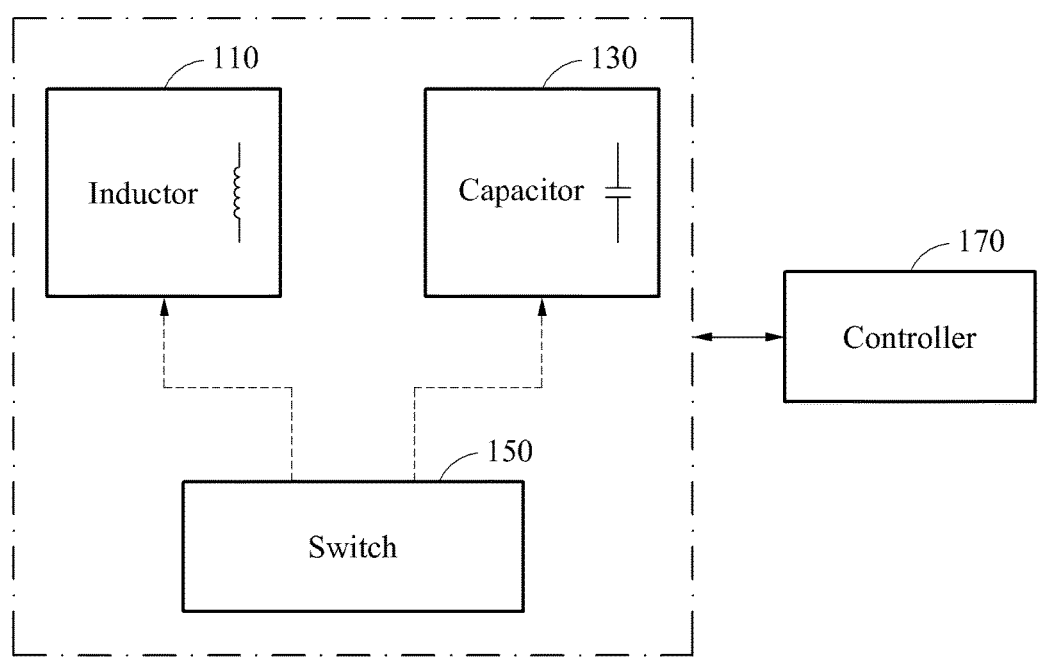
FIG. 1 illustrates an example of a resonator.

Throughout the drawings and the detailed description, unless otherwise described or provided, the same drawing reference numerals will be understood to refer to the same or similar elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Particular structural or functional descriptions of the examples described herein are merely intended for the purpose of describing the examples described herein and may be implemented in various forms. However, it should be understood that these examples are not construed as limited to the illustrated forms and include all changes, equivalents or alternatives within the idea and the technical scope of this disclosure.

Although terms of "first," "second," and the like are used to explain various components, the components are not limited to such terms. These terms are used only to distinguish one component from another component. For example, a first component may be referred to as a second component, or similarly, the second component may be referred to as the first component within the scope of the present invention.

When it is mentioned that one component is "connected" or "accessed" to another component, it may be understood that the one component is directly connected or accessed to another component or that still another component is interposed between the two components.

The terminology used herein is for the purpose of describing particular examples only and is not to be limiting of the examples. As used herein, the singular forms "a", "an", and "the" are intended to include the plural forms as well, unless the context clearly indicates otherwise. It will be further understood that the terms "include/comprise" and/or "have" when used in the specification, specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which examples belong based on an understanding of the present disclosure. It will be further understood that terms, such as those defined in commonly-used dictionaries, should be interpreted as having a meaning that is consistent with their meaning in the context of the relevant art and the present disclosure and will not be interpreted in an idealized or overly formal sense unless expressly so defined herein.

Hereinafter, examples are described in detail with reference to the accompanying drawings. However, the scope of the examples is not limited to the descriptions provided in the present specification. The same reference numerals in the drawings refer to the same or like elements.

Figure 2A:
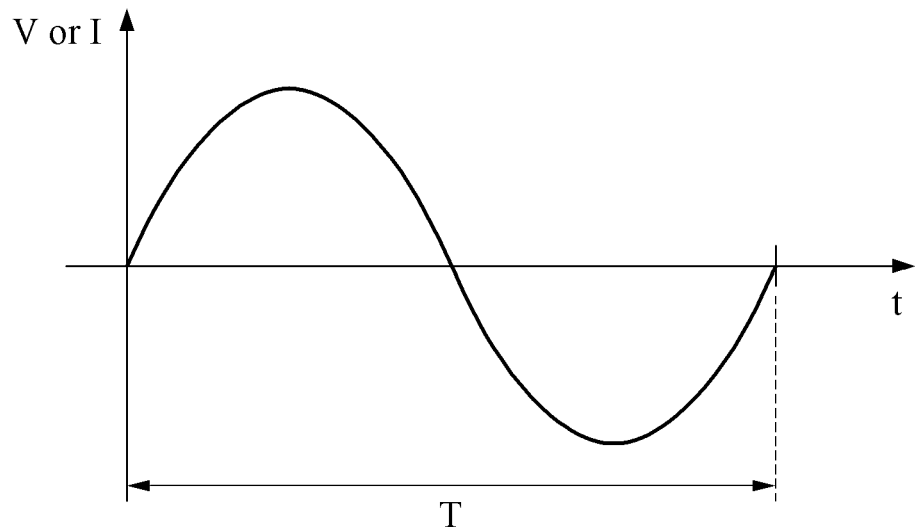
FIGS. 2A-2B illustrate an example of a frequency calibration operation of a resonator.
Figure 2B:
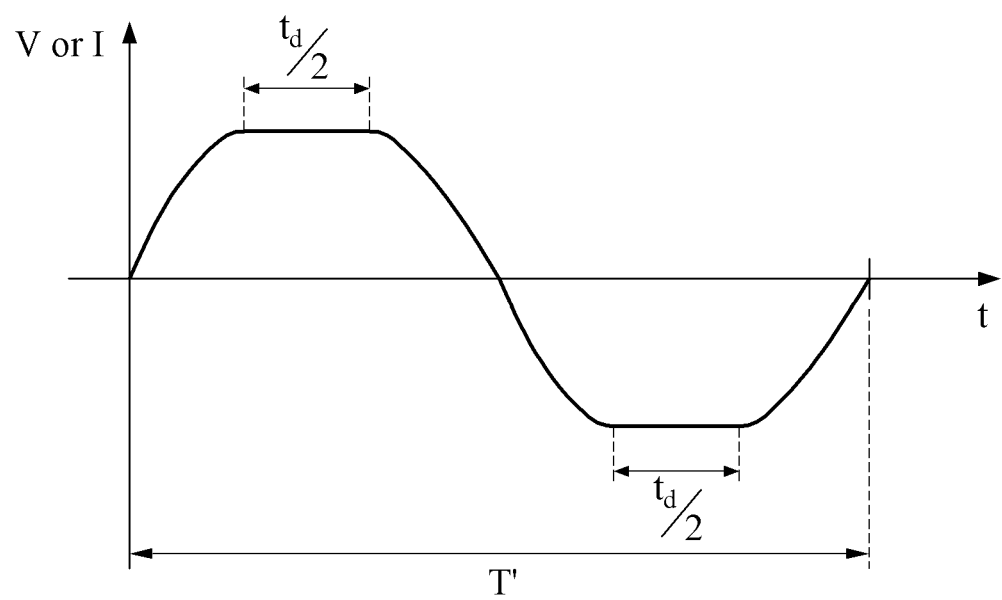

FIG. 1 illustrates an example of a resonator, and FIGS. 2A-2B illustrate an example of a frequency calibration operation for a resonator. As only an example, and for convenience of explanation, FIGS. 2A-2B will be used to illustrate an example of a frequency calibration operation of the resonator 100 of FIG. 1.

Referring to FIG. 1, the resonator 100 includes an inductor 110, a capacitor 130, a switch 150, and a controller 170.

The resonator 100 generates a wave or vibration of a predetermined frequency, for example, a resonant frequency, based on a resonance phenomenon between the inductor 110 and the capacitor 130. The resonator 100 may be used for, as only examples, a filter, an oscillator, a frequency counter, a tuned amplifier, and/or a laser, depending on embodiment. Also, in differing embodiments, the resonator 100 is used in, for example, a communication technology, a medical technology, or a wireless power transmission technology.

A resonant frequency of the resonator 100 may vary (or drift) due to various factors, for example, a surrounding exterior environment. The resonator 100 may be properly calibrated to adjust for the varying resonant frequency. In addition, in one or more embodiments, where resonance matching is performed between two or more resonators 100, for example, either or both of the resonators 100 may control/calibrate their resonant frequencies to match each other.

The switch 150 maintains an energy in at least one of the inductor 110 and the capacitor 130 during a predetermined period of time. For example, based on a control of the controller 170, the switch 150 maintains without change energy in at least one of the inductor 110 and the capacitor 130 during/for a predetermined period of time. As only examples, energy maintained in the inductor 110 may be maintained as magnetic energy represented by inductor current and energy maintained in the capacitor 130 may be maintained as electrical energy represented by capacitor voltage.

In an example, the resonator 100 may be controlled to continue to resonate through such maintaining of energy in the inductor 110 by a select operation of the switch 150 during/for a predetermined period of time and a transferring of the maintained energy to the capacitor 130.

In another example, the resonator 100 may be controlled to continue to resonate thorough a maintaining of energy in the capacitor 130 by a select operation of the switch 150 during/for a predetermined period of time and a transferring of the maintained energy to the inductor 110.

In still another example, the resonator 100 may be controlled to continue to resonate while maintaining respective energy in the inductor 110 and the capacitor 130 by a select operation of the switch 150 during/for a predetermined period of time.

In other words, depending on embodiment, the resonator 100 may be controlled to continue to resonate while maintaining energy in at least one of the inductor 110 and the capacitor 130 through select operation of at least the switch 150 during/for a predetermined period of time.

A resonant frequency (for example, $f_r=1/T$) of the resonator 100 before the resonant frequency is calibrated may be represented by the below Equation 1, for example.

$$f_r = \frac{1}{2\pi\sqrt{LC}}$$ Equation 1

Referring to FIGS. 2A-2B, when the resonant frequency fr of the resonator 100 is calibrated, a resonance cycle T' (FIG. 2B) of the resonator 100 becomes greater than the pre-calibration resonance cycle T (FIG. 2A) by a period of time $t_d$, e.g., $t_d/2$ for each half T cycle, by maintaining energy in at least one of the inductor 110 and the capacitor 130. Accordingly, the resonance cycle T' may be represented by the below Equation 2, for example.

$$T'=T+t_d$$ Equation 2

For Equation 2, a ratio of the period of time $t_d$ (for example, the energy maintenance interval) to the original cycle T may be denoted as α as shown in the below Equation 3, for example.

$$\alpha=t_d/T$$ Equation 3

When Equation 3 is substituted into Equation 2, T' may alternatively be represented by the below Equation 4, for example.

$$T'=T+\alpha T$$ Equation 4

When Equation 1 is substituted into Equation 4, a calibrated resonant frequency $f'_r$ of the resonator 100 may be represented by the below Equation 5, for example.

$$f'_r = \frac{1}{2\pi\sqrt{(1+\alpha)^2 LC}}$$ Equation 5

In other words, the resonator 100 may be controlled to change the resonant frequency of the resonator 100 by maintaining energy in at least one of the inductor 110 and the capacitor 130 through select operation of switch 150 during/for a predetermined period of time.

In an example, the controller 170 controls an overall operation of the resonator 100, such as where controller 170 controls, for example, an operation of each of the inductor 110, the capacitor 130, and the switch 150.

In addition, the controller 170 may control selective operations of the switch 150. For example, the controller 170 controls an operating time of the switch 150, e.g., how long the switch respectively operates for a select operation, based on a value associated with at least one of the inductor 110 and the capacitor 130. A period of time (for example, an energy maintenance interval) during which energy is maintained in at least one of the inductor 110 and the capacitor 130 may be controlled to change based on the operating time of the switch 150, as controlled by the controller 170. As only an example, the controlled operations of the switch 150 may include, for example, the switch 150 being controlled to be on for period of time (on-time) and the switch 150 being control to be off for a period of time (off-time).

The resonator 100 may set the energy maintenance interval to control the maintenance of energy in at least one of the inductor 110 and the capacitor 130, and control an operating timing, for example, such an on-off timing of the switch 150 through operational control of the controller 170, to continue or continuously/automatically calibrate or change/adjust a resonant frequency of the resonator 100 through varying changes of the energy maintenance interval. For example, such continuous calibration may be used to perform a resonance matching with another resonator or to counteract an experienced drift of the resonator, e.g., without having to change inductive or capacitive characteristics of the resonator, or in combination with the same.

It has been found that for typical resonators, as discussed above, to have an adjustable resonance capability, the typical resonator must have a large size, or must use a substantial amount of area, to accommodate all of switches, inductors, and capacitors for each of the capable resonance frequencies, even if some of those available resonance frequencies are never used. Further, even with the additional devices and components the typical resonator will still be limited in the granularity or discreteness in which the resonance frequency can be adjusted. In the example wireless power transmission field this mismatching of resonances between a typical reception end and a typical transmission end may result in inefficient power transmission.

Rather, in an embodiment where the resonator 100 includes the inductor 110 and the capacitor 130 without such additional inductances or capacitances capabilities, such as where the resonator 100 does not include (or alternatively only includes a reduced number compared to the typical resonator for the same resonant frequency) varying switchable capacitors with differing capacitances and/or multiple available inductances through different intermediate portions of an inductor or through switchable plural inductors, it is possible for the resonator 100 to have an area or size that is less than the typical resonator that uses such additional switchable capacitances or inductances to achieve the same or similar resonance frequency. In addition, by using or adjusting an energy maintenance interval according to one or more embodiments the resonator 100 may be able to have more selectable, discrete, or granule control of varying resonant frequencies compared to the typical resonator. For example, in a wireless power transmission embodiment, with this greater control of the varying resonant frequencies there may be a more efficient energy transmission with more accurate resonance matching compared to the typical resonator in either of a reception end (receiver) and a transmission end (transmitter). Depending on embodiment, and only as an example, the resonator 100 may be included in either or both of the reception end and transmission end and either or both of the reception end and transmission end may selectively control their respective resonance frequencies by controlling respective energy maintenances. As only an example, the transmission end may be a power supply and the reception end may be mobile device, such as a mobile phone or wearable device.

Below FIGS. 3A-9 set forth example circuit configurations of a resonator, such as of the resonator 100 of FIG. 1, according to one or more embodiments. Below, for convenience of explanation, the examples of FIGS. 3A-10, 13, and 16 will be explained through references to the resonator 100 of FIG. 1, including the inductor 110, the capacitor 130, and the switch 150 being respectively configured according to FIGS. 3A, 4A, 5-10, 13, and 16, though such embodiments are also not limited thereto. In addition, similar to the illustration of FIG. 1, FIGS. 3A, 4A, 5-10, 13, and 16 also separately illustrate respective LC circuits, identified by the dashed lines, separately from the example respective controllers. Though such illustrations demonstrate embodiments where the controller is separate from the respective LC circuits, respective embodiments are not limited thereto.

Figure 3A:
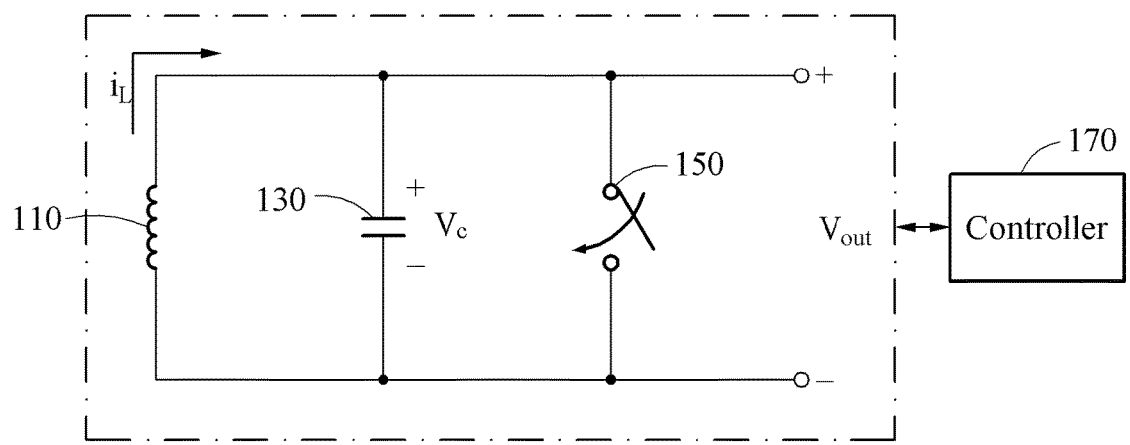
FIGS. 3A-9 illustrate example circuit configurations of a resonator, such as of the resonator of FIG. 1.
Figure 4A:
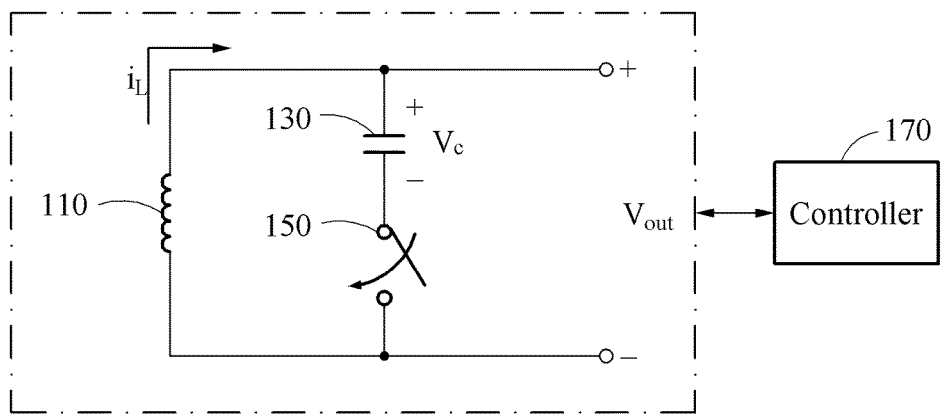
Figure 5:
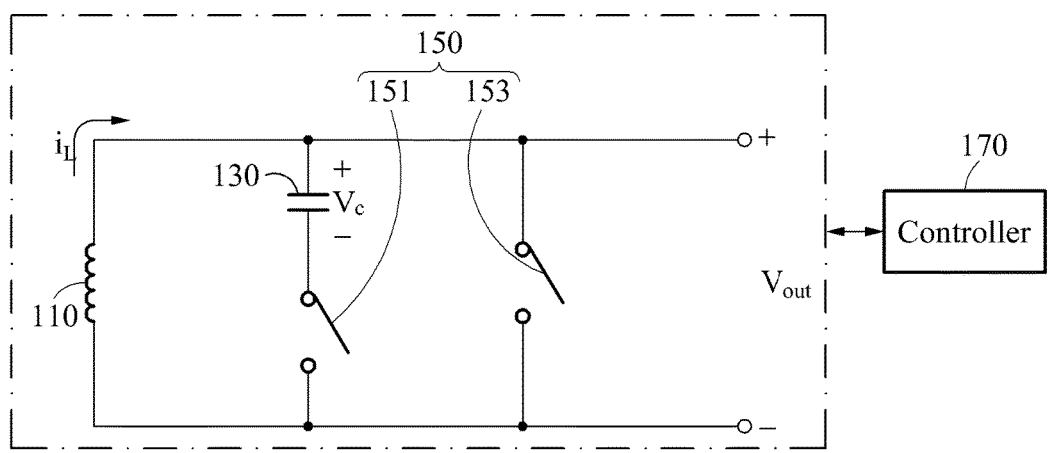

FIGS. 3A, 4A and 5 illustrate examples in which the inductor 110 and the capacitor 130 of the resonator 100 are connected in parallel.

Referring to FIG. 3A, the switch 150 is a switch configured to maintain an energy in the inductor 110 during/for a predetermined period of time. For example, the switch 150 is connected in parallel to the inductor 110. Herein, the maintenance of energy in either of the inductor 110 and/or capacitor 130 may mean that the respective energy is maintained in the inductor 110 and/or capacitor 130 to not change, e.g., during the predetermined period of time.

In an example, when the inductor 110 and the capacitor 130 exchange magnetic energy of the inductor 110 and electric energy of the capacitor 130 with each other in forms of a current and a voltage, the switch 150 may be controlled, by the controller 170, to turn on (for example, controlled to implement a short) at a point in time corresponding to a greatest or peak current flowing in the inductor 110 (for example, a point in time corresponding to zero volts (V) of a voltage of the capacitor 130).

In this example, because the voltage of zero V is applied to both ends of the inductor 110, the current flowing in the inductor 110 is maintained without a change. In other words, the magnetic energy of the inductor 110 is being maintained in the inductor 110.

Figure 3B:
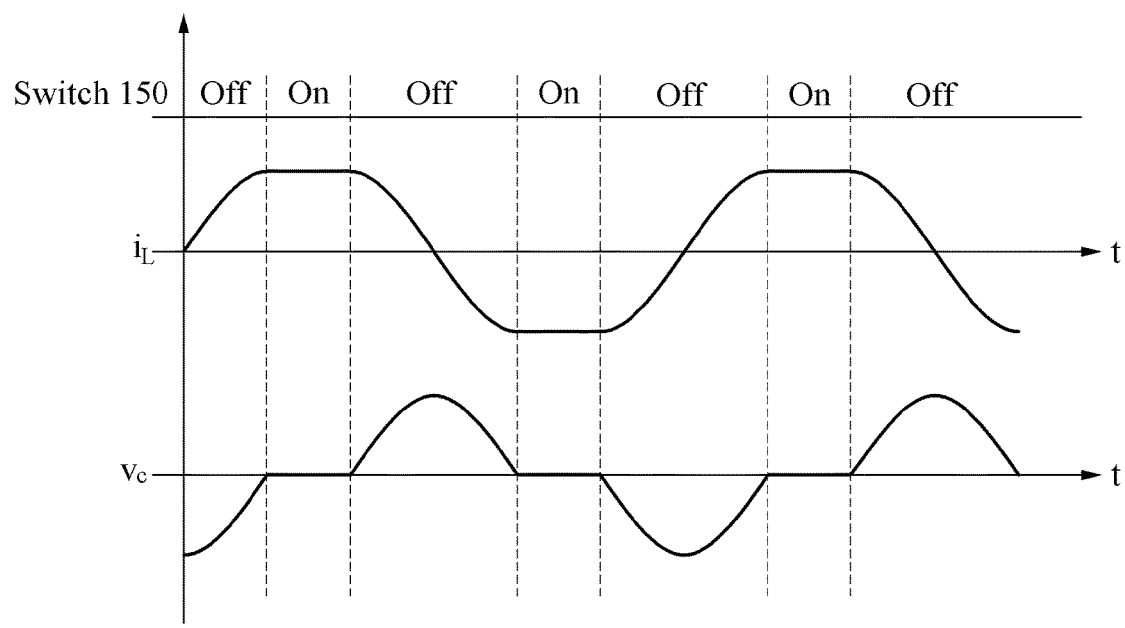

When an on state of the switch 150 is changed, e.g., by the controller 170, to an off state after a predetermined period of time has elapsed, the magnetic energy maintained in the inductor 110 is transmitted to the capacitor 130. For example, FIG. 3B illustrates example waveforms for the current $I_L$ of the inductor 110 and the voltage $V_c$ of the capacitor 130 as the switch 150 is changed from the off state to the on state, and from the on state to the off state, with a set maintenance of the respective energy levels at the point in time the switch 150 is turned on and for a set period of time until the switch 150 is turned off.

Thus, the resonator 100 continues to resonate by maintaining energy in the inductor 110 using the switch 150 during/for the predetermined period of time and transferring the maintained energy to the capacitor 130.

For example, when the resonator 100 is implemented in a wireless power transmission system embodiment, the switch 150 connected in parallel to the inductor 110 and the capacitor 130 may also be used for backscattering. As another example, a typical or fixed LC circuit of a reception end or transmission end, of such as in a wireless power transmission system embodiment, that has an existing switch for backscattering may be additionally controlled, e.g., by the controller 170, to operate to maintain energy in the inductor 110 during a predetermined period of time according to one or more embodiments. In such an embodiment, and only as an example, a backscattering switch of a typical LC circuit of a reception end or transmission end may be selectively repurposed by inclusion of the controller 170 in the respective reception end or transmission end to selectively control the maintenance of energy according to one or more embodiments.

Referring to FIG. 4, the switch 150 is a switch configured to maintain energy in the capacitor 130 during/for a predetermined period of time. For example, the switch 150 is connected in series to the capacitor 130.

In an example, when the inductor 110 and the capacitor 130 exchange a magnetic energy of the inductor 110 and an electric energy of the capacitor 130 with each other in forms of a current and a voltage, the switch 150 may be controlled, by the controller 170, to turn off at a point in time corresponding to a highest or peak voltage of the capacitor 130 (for example, a point corresponding to zero ampere (A) of a current of the inductor 110).

In this example, because the current of zero A flows in the capacitor 130, the voltage of the capacitor 130 is maintained without a change. In other words, the electric energy of the capacitor 130 is being maintained in the capacitor 130.

Figure 4B:
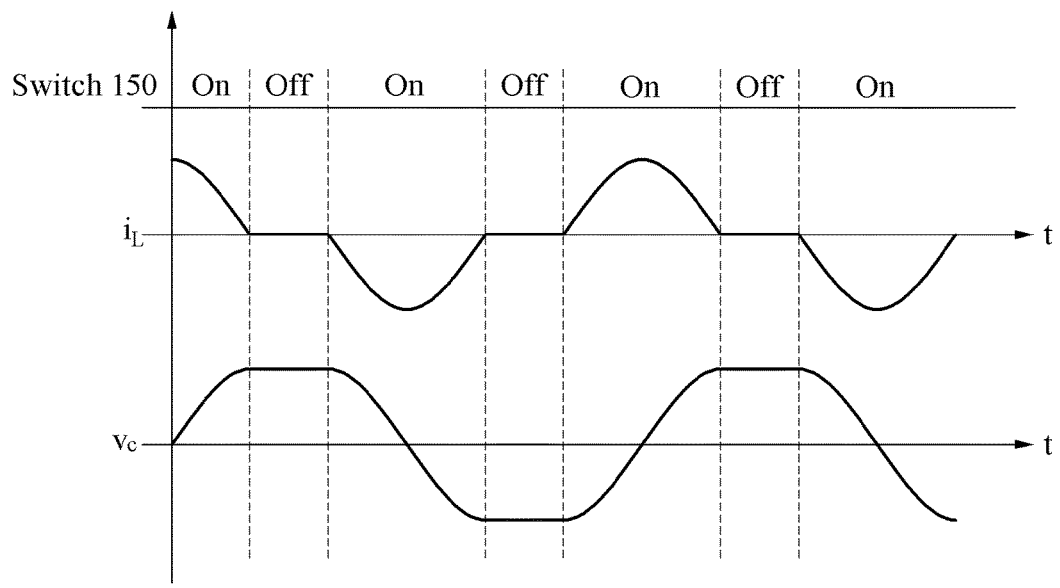

When an off state of the switch 150 is changed, e.g., by the controller 170, to an on state after a predetermined period of time has elapsed, the electric energy maintained in the capacitor 130 is transmitted to the inductor 110. For example, FIG. 4B illustrates example waveforms for the current IL of the inductor 110 and the voltage $V_c$ of the capacitor 130 as the switch 150 is changed from the on state to the off state, and from the off state to the on state, with a set maintenance of the respective energy levels at the point in time the switch 150 is turned off and for a set period of time until the switch 150 is turned on.

Thus, the resonator 100 continues to resonate by energy in the capacitor 130 using the switch 150 during/for the predetermined period of time and transferring the maintained energy to the inductor 110.

Referring to FIG. 5, the switch 150 is a switch configured to maintain an energy in the inductor 110 and the capacitor 130 during/for a predetermined period of time.

In the examples of FIGS. 3A and 4A, the resonator 100 maintains an energy in either the inductor 110 or the capacitor 130 using the switch 150. However, to maintain the energy in either the inductor 110 or the capacitor 130 without energy loss, an operating timing, for example, an "on" timing or "off" timing, of the switch 150 may be desired to be matched to, or coincident with, a peak of the energy of either the inductor 110 or the capacitor 130.

In the example of FIG. 3A, when the switch 150 is turned on in a state in which the magnetic energy of the inductor 110 does has not yet reached its peak, electric energy that has not yet been transferred to the inductor 110 remains in the capacitor 130 and is released/loss as thermal energy. In the example of FIG. 4A, when the switch 150 is turned off in a state in which the electric energy of the capacitor 130 has not yet reached its peak, magnetic energy that has not yet been transferred to the capacitor 130 remains in the inductor 110 and is released/loss as thermal energy.

The switch 150 of FIG. 5 maintains both the magnetic energy of the inductor 110 and the electric energy of the capacitor 130 based on the control of the controller 170. The switch 150 includes a first switch 151 configured to maintain energy in the capacitor 130 during/for a predetermined period of time, and a second switch 153 configured to maintain energy in the inductor 110 during/for a predetermined period of time.

The controller 170 separately controls an on-off timing of each of the first switch 151 and the second switch 153. For example, the controller 170 separately controls an on-off timing of each of the first switch 151 and the second switch 153 so that the magnetic energy of the inductor 110 and the electric energy of the capacitor 130 are out of phase with each other.

In this example, the magnetic energy of the inductor 110 and the electric energy of the capacitor 130 are maintained without a change based on an operating timing of the first switch 151 and an operating timing of the second switch 153, respectively. When the first switch 151 and the second switch 153 operate in opposite states (for example, when the first switch is in an on state, the second switch is in an off state, and vice versa), the inductor 110 and the capacitor 130 exchange energies with each other. In other words, resonance between the inductor 110 and the capacitor 130 is properly restarted from a point in time at which energy is maintained.

Here, in FIG. 5, resonator 100 continues to resonate by maintaining energy in the inductor 110 and the capacitor 130 using the first switch 151 and the second switch 153 during/for a predetermined period of time and exchanging the maintained energy with each other with minimized or without energy loss.

As described above with reference to FIGS. 3A through 5, when the controlled on or off of the switch 150 is repeated during/for respective predetermined periods of time at preset intervals (for example, at a point during each half cycle), the resultant resonance cycle of the resonator 100 becomes greater than a typical resonant cycle, such as discussed above with regard to FIG. 2B. Thus, here, the resonant frequency of the resonator 100 changes to be less than the resonant frequency of the inductor 110 and the capacitor 130 alone without energy maintenance according to one or more embodiments.

Figure 6:
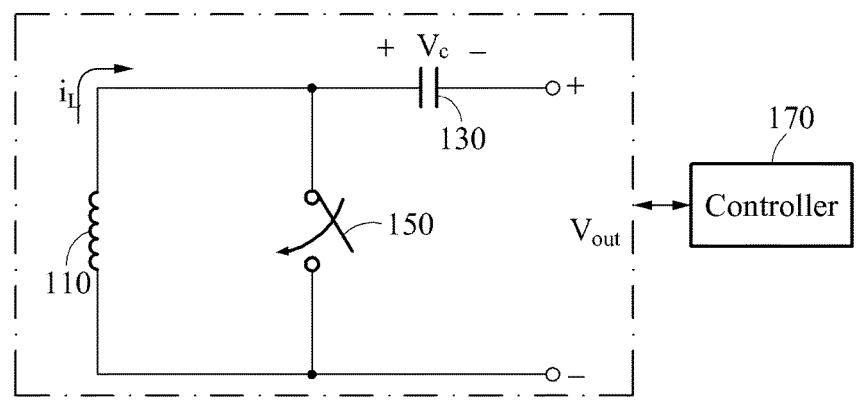
Figure 7:
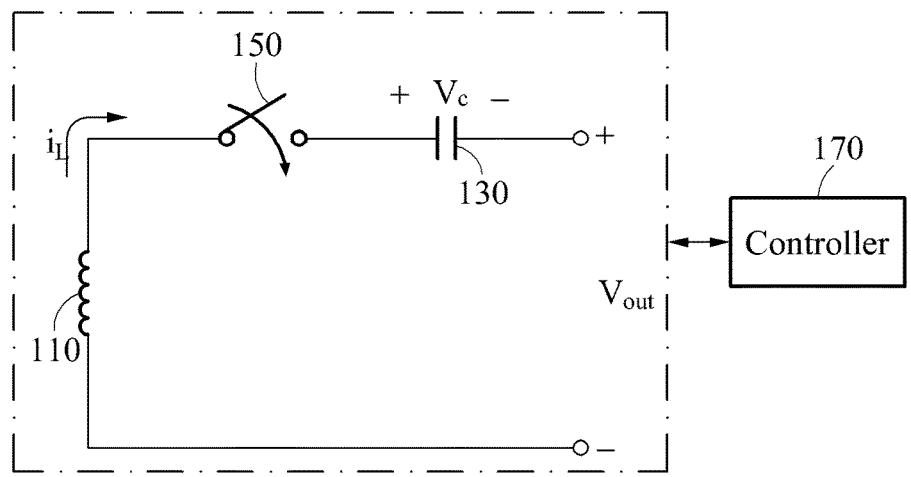
Figure 8:
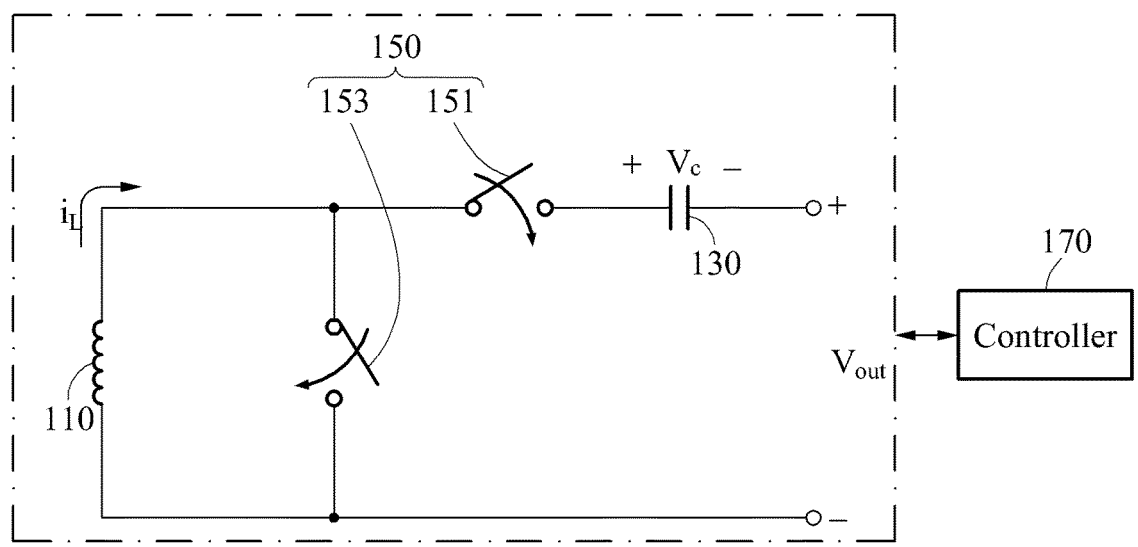

Referring to FIGS. 6 through 8, the inductor 110 and the capacitor 130 in the respective resonators 100 are connected in series. Respective connection structures between the inductor 110 and the capacitor 130 of FIGS. 6 through 8 are different from the respective connection structures between the inductor 110 and the capacitor 130 of FIGS. 3A through 5, however, an operation of each of the respective inductors 110, capacitors 130, switches 150, and controllers 170 of FIGS. 6 through 8 may otherwise be controlled substantially the same as corresponding operations of each of the respective inductors 110, capacitors 130, switches 150 and controllers 170 of FIGS. 3A through 5. Accordingly, the description of the operation of the respective resonators 100 of FIGS. 3A through 5 is also applicable to the respective resonators 100 of FIGS. 6 through 8.

Figure 9:
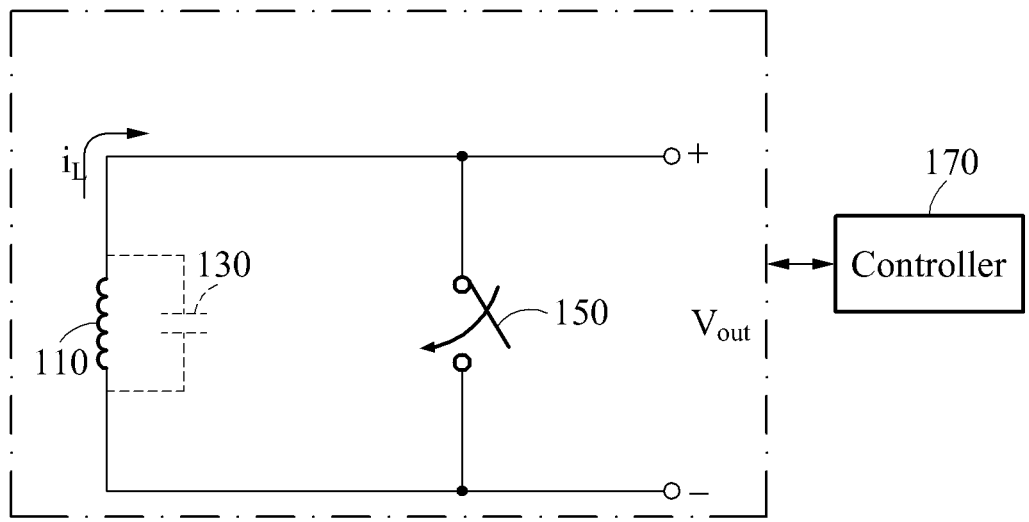

Referring to FIG. 9, a switch 150 may be a switch configured to maintain an energy in the inductor 110 during a predetermined period of time. For example, in FIG. 9, the switch 150 is connected in parallel with the inductor 110. The calibration illustration of FIG. 2B may similarly be representative of energy being maintained in the corresponding inductor during such a predetermined period of time where the switch is connected in parallel with the inductor.

In FIG. 9, the capacitor 130 is, for example, a parasitic capacitor of the inductor 110. Accordingly, a desired resonance frequency may be provided using a capacitor smaller than a capacitor that would be required in a typical resonator for the same resonance frequency. For example, when the needed or desired size or capacitance of the capacitor 130 is reduced to a limited or minimal value, the parasitic capacitor of the inductor 110 can be used as the capacitor 130 instead of the separate capacitor 130 of FIGS. 3A-8. Accordingly, when the resonator 100 uses the parasitic capacitor of the inductor 110 as the capacitor 130, the resonator 100 may require a smaller area of a device compared to a typical resonator and potentially smaller area than the resonators 100 of FIGS. 3A-8.

Here, with regard to FIG. 9, the controlled operation of each of the inductor 110, the capacitor 130, the switch 150, and the controller 170 in the resonator 100 of FIG. 9 may be substantially the same as the controlled operations of each of the inductor 110, the capacitor 130, the switch 150, and the controller 170 in the resonator 100 of FIG. 3A, for example. Accordingly, the description of the operation of the resonator 100 of FIG. 3A is also applicable to the resonator 100 of FIG. 9.

Hereinafter, a configuration and an operation of a controller to control an on-off time of the switch 150 of FIG. 1, for example, will be described. Also, an operation of the resonator 100 to determine an initial resonant frequency and to calibrate a varying resonant frequency based on the control of the controller 170 will be further described.

Figure 10:
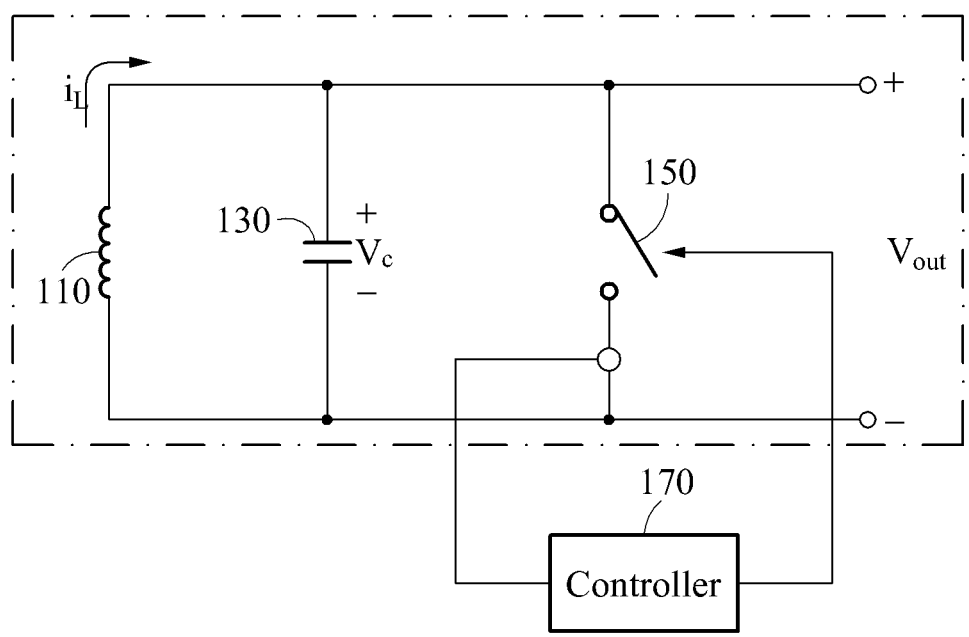
FIG. 10 illustrates an example of an operating method of a controller.

FIG. 10 illustrates an example of an operating method of a controller, such as the controller 170 of FIG. 1, noting the embodiments are not limited to the same. Below, for convenience of explanation, the example of FIG. 10 will be explained through references to the resonator 100 of FIGS. 1 and 3A, including respective inductors 110, capacitors 130, switches 150, and controllers 170, though such embodiments of FIG. 10 are also not limited thereto.

Referring to FIG. 10, the controller 170 controls an operating time of the switch 150 based on a value associated with the inductor 110. For example, the controller 170 senses or measures a current of the inductor 110. The controller 170 controls the operating time of the switch 150 based on a value or a magnitude of the sensed current.

The operating time of the switch 150 is, for example, an on-time or an off-time. For example, the switch 150 operates at half cycle intervals in accordance with the operating time.

As described above with reference to FIGS. 1 and 2, when the switch 150 is turned on, a current flowing in the inductor 110 may be maintained the same or without change during/for an energy maintenance interval. An on state of the switch 150 may correspond to the current flowing in the inductor 110 being maintained using the switch 150.

During the energy maintenance interval, the controller 170 monitors energy stored in the resonator 100 by sensing or measuring a value of current flowing in the switch 150.

The controller 170 determines or searches for an appropriate on-time of the switch 150 to control the resonator 100 to resonate with a greater amount of energy, by adjusting the on-time.

For example, the controller 170 determines an optimum on-time of the switch 150 for the most efficient resonance during a cycle, and controls the switch 150 based on the determined on-time.

In an example, the cycle is set based on a minimum operating time and a maximum operating time of the switch 150. In another example, the cycle is set based on a number of times the operating time of the switch 150 changes. In still another example, the cycle is set based on a predetermined period of time to control when to change the operating time of the switch 150.

As described above, a resonant frequency of the resonator 100 is controlled based on the determined on-time of the switch 150. Here, though the switch 150 may have different configurations depending on embodiment, in this example the on-time of the switch 150 of FIG. 10 corresponds to a short or connection being created, such as across the parallel inductor 110 and capacitor 130 or between the $V_{out}$ terminals in FIGS. 3A or 10.

Figure 11:
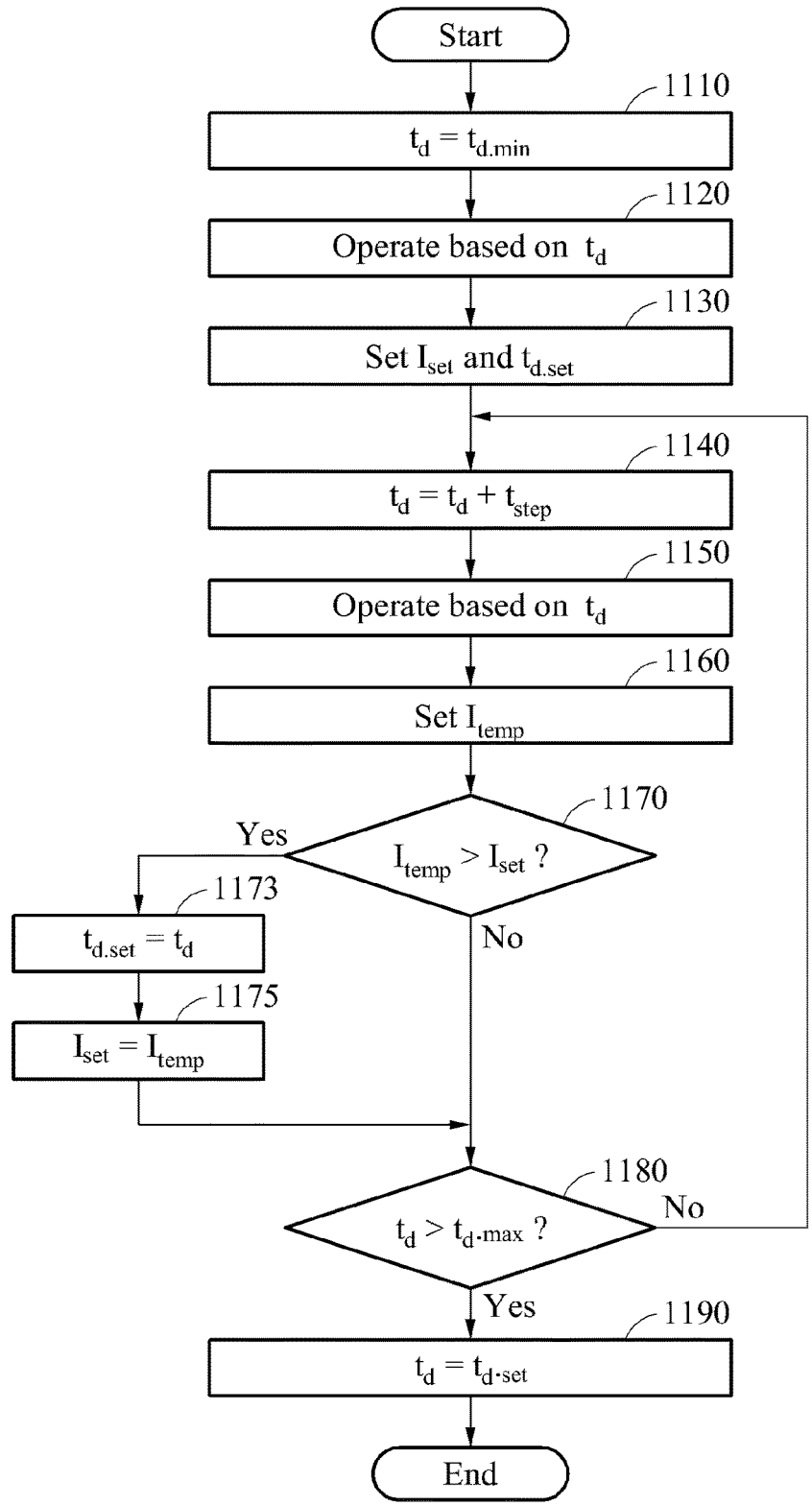
FIG. 11 illustrates example operations of a resonator method to determine an optimum resonant frequency during initial setting.

FIG. 11 illustrates examples operations of a resonator method to determine an optimum resonant frequency during initial setting. Below, for convenience of explanation, the example of FIG. 11 will be explained through references to the resonator 100 of FIG. 10, though such embodiments of FIG. 11 are also not limited thereto.

Referring to FIGS. 10 and 11, when a resonant frequency of the resonator 100 of FIG. 10 is initially set, the controller 170 determines or searches for an optimum or sufficiently appropriate resonant frequency while continuously changing an operating time $t_d$ of the switch 150 from a first operating time $t_{d.min}$ to a second operating time $t_{d.max}$. Here, $t_{d.min}$ may correspond to a shorter or minimum length/period/operating time for the switch 150, while $t_{d.max}$ may correspond to a longer or maximum length/period/operating time for the switch 150. $t_{d.max}$ may also be dependent on a maximum resonant cycle T. In an example, depending on the operating time $t_d$, the switch 150 may be controlled to switch from the off-time state to the on-time state at half cycle intervals during. In addition, the operating time $t_d$ is, for example, an on-time or an off-time, depending on the configuration and orientation of the switch 150.

In operation 1110, the controller 170 sets the operating time $t_d$ to the first operating time $t_{d.min}$.

Thus, in operation 1120, the resonator 100 operates based on the set operating time $t_d$. In operation 1130, the controller 170 sets a resonance time $t_{d.set}$ to have the value of the first operating time $t_{d.min}$, senses or measures a value of a current flowing in the switch 150 during the set operating time $t_d$, and sets a first current value $I_{set}$ to be the sensed value of the current. After all operations of FIG. 11 have been performed, the first current value $I_{set}$ may desirably be, for example, a maximum resonant current value corresponding to a maximum of the set resonance times $t_{d.set}$.

In operation 1140, the controller 170 increases the operating time $t_d$ by a predetermined time $t_{step}$.

In operation 1150, the resonator 100 operates based on the increased operating time $t_d$. In operation 1160, the controller 170 senses or measures a value of a current flowing in the switch 150 during the increased operating time $t_d$ and sets a second current value $I_{temp}$ to have the sensed value of the current. The second current value $I_{temp}$ may be used as, for example, a temporary current value.

In operation 1170, the controller 170 compares the first current value $I_{set}$ to the second current value $I_{temp}$.

When the second current value $I_{temp}$ is greater than the first current value $I_{set}$, the controller 170 sets the resonance time $t_{d.set}$ to be the increased operating time $t_d$ in operation 1173. In operation 1175, the controller 170 resets the first current value $I_{set}$ to have the value of the sensed or measured current from operation 1160.

In operation 1180, the controller 170 compares the increased operating time $t_d$ to the second operating time $t_{d.max}$.

When the increased operating time $t_d$ is greater than the second operating time $t_{d.max}$, the controller 170 determines the resonance time $t_{d.set}$ to be an optimum operating time $t_d$ to subsequently use to generate an optimum resonant frequency of the resonator 100 in operation 1190.

When the increased operating time $t_d$ is equal to or less than the second operating time $t_{d.max}$, operations 1140 through 1180 are repeatedly performed until the example incrementally increased operating time $t_d$ is greater than the second operating time $t_{d.max}$.

Accordingly, in the example of FIG. 11, the resonant frequency of the resonator 100 is determined based on the resonance time $t_{d.set}$, which is selectively updated through repetitions of operations 1140-1180 based on whether the latest sensed or measured current is greater than the previous largest sensed or measured current.

Figure 12:
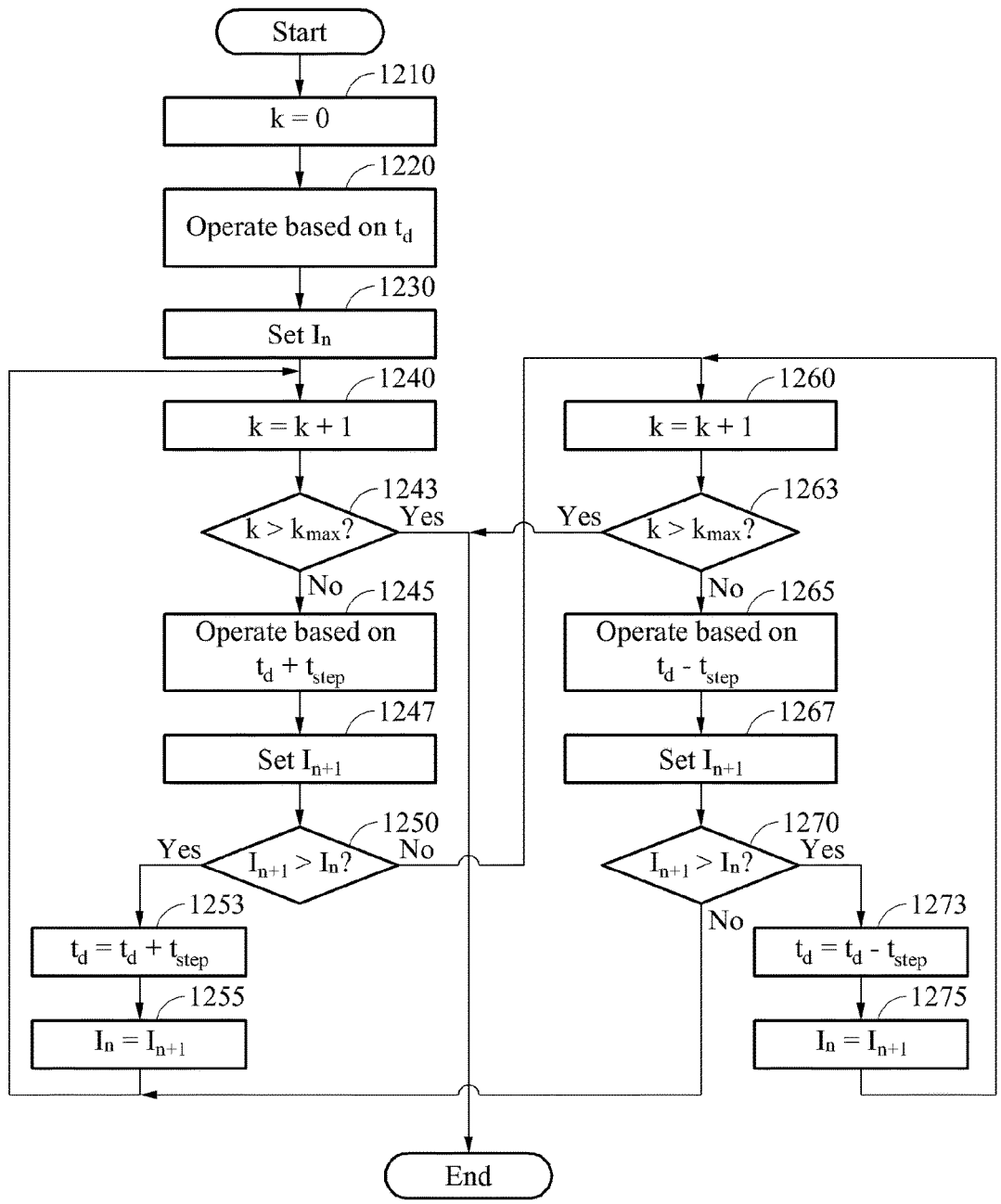
FIG. 12 illustrates example operations of a resonator method to calibrate a set resonant frequency when the resonant frequency varies.

FIG. 12 illustrates example operations of a resonator method to calibrate a set resonant frequency when the resonant frequency varies. Below, for convenience of explanation, the example of FIG. 12 will be explained through references to the resonator 100 of FIG. 10, though such embodiments of FIG. 12 are also not limited thereto.

Referring to FIGS. 10 and 12, when a currently set resonant frequency of the resonator 100 varies or is desired to vary, the controller 170 calibrates the resonant frequency while changing an operating time $t_d$ of the switch 150 by a predetermined period of time. The controller 170 calibrates the resonant frequency up to a predetermined number $k_{max}$ of times by incrementally increasing the number k each time the operating time $t_d$ is changed.

When the currently set resonant frequency varies or adjustment of the resonant frequency is desired, such as for when resonant matching with another resonator is desired for wireless power transfer, the controller 170 sets the number k to zero in operation 1210.

In operation 1220, the resonator 100 operates based on an operating time $t_d$ corresponding to the number k. In operation 1230, the controller 170 senses a value of a current flowing in the switch 150 during the operating time $t_d$ and sets a first current value $I_n$ to have the sensed value of the current.

The controller 170 resets the number k by incrementing the number k by one in operation 1240, and compares the reset number k to the number $k_{max}$ in operation 1243.

When the reset number k is greater than the number $k_{max}$ in operation 1243, the controller 170 terminates calibrating of the resonant frequency. Here, when controller 170 terminates the calibrating, the controller 170 determines a final operating time $t_d$ corresponding to the then present (i.e., based on k) first current value $I_n$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1243, the resonator 100 operates based on an operating time "$t_d+t_{step}$" in operation 1245. The operating time "$t_d+t_{step}$" is obtained by adding a predetermined time $t_{step}$ to the operating time $t_d$ corresponding to the number k. For example if the number k has been incremented several times already through repetitions of operation 1240 then $t_d$ would have been incremented by $t_{step}$ several times. In operation 1247, the controller 170 senses a value of the current flowing in the switch 150 during the operating time "$t_d+t_{step}$" and sets a second current value $I_{n+1}$ to be the sensed value of the current.

In operation 1250, the controller 170 compares the first current value $I_n$ to the second current value $I_{n+1}$.

When the second current value $I_{n+1}$ is greater than the first current value $I_n$ in operation 1250, the controller 170 resets the operating time $t_d$ to have the value of the operating time "$t_d+t_{step}$" in operation 1253, and resets the first current value $I_n$ to have the value of the current sensed in operation 1247, i.e., by resetting the first current value $I_n$ to have the value of the second current value $I_{n+1}$, in operation 1255. The controller 170 then repeats operations 1240-1243 and terminates calibration if the incremented k is now greater than $k_{max}$ (operation 1243) or otherwise continues with the repetition of the remaining operations according to the flow chart beginning with operation 1245.

When the second current value $I_{n+1}$ is equal to or less than the first current value $I_n$ in operation 1250, the controller 170 resets the number k by incrementing the number k by one in operation 1260, and compares the reset number k to the number $k_{max}$ in operation 1263. In other words, the controller 170 performs operations from operation 1260 when the second current value $I_{n+1}$ is equal to or less than the first current value $I_n$ in operation 1250.

When the reset number k is greater than the number $k_{max}$ in operation 1263, the controller 170 terminates the calibrating of the resonant frequency. Here, when controller 170 terminates the calibrating, the controller 170 determines a final operating time $t_d$ corresponding to the present first current value $I_n$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1263, the resonator 100 operates based on an operating time "$t_d-t_{step}$" in operation 1265. The operating time "$t_d-t_{step}$" is obtained by subtracting the predetermined time $t_{step}$ from the operating time $t_d$ corresponding to the number k. In operation 1267, the controller 170 senses the value of current flowing in the switch 150 during the operating time "$t_d-t_{step}$" and sets the second current value $I_{n+1}$ to be the sensed value of the current.

In operation 1270, the controller 170 compares the first current value $I_n$ to the second current value $I_{n+1}$.

When the second current value $I_{n+1}$ is greater than the first current value $I_n$ in operation 1270, the controller 170 sets the operating time $t_d$ to have the value of the operating time "$t_d-t_{step}$" in operation 1273, and resets the first current value $I_n$ to have the value of the sensed value of the current from operation 1267, i.e., resets the first current value $I_n$ to have the value of the second current value $I_{n+1}$, in operation 1275. The controller 170 then repeats operations 1260-1263 and terminates calibration if the incremented k is now greater than $k_{max}$ (operation 1263) or otherwise continues with the repetition of the remaining operations according to the flow chart beginning with operation 1265.

Here, when the second current value $I_{n+1}$ is equal to or less than the first current value $I_n$ in operation 1270, the controller 170 returns to operation 1240 according to the flow chart.

Accordingly, in the example of FIG. 12, the resonant frequency of the resonator 100 is determined based on the final resonance time $t_d$ which has been selectively updated through repetitions of operations 1253 and 1273 based on whether the then latest sensed or measured current, e.g., in respective operations 1247 and 1267, was greater than the previous largest sensed or measured current. The final resonance time $t_d$ may thus represent the largest sampled current, and may correspond to the resonating frequency with the greatest energy.

Figure 13:
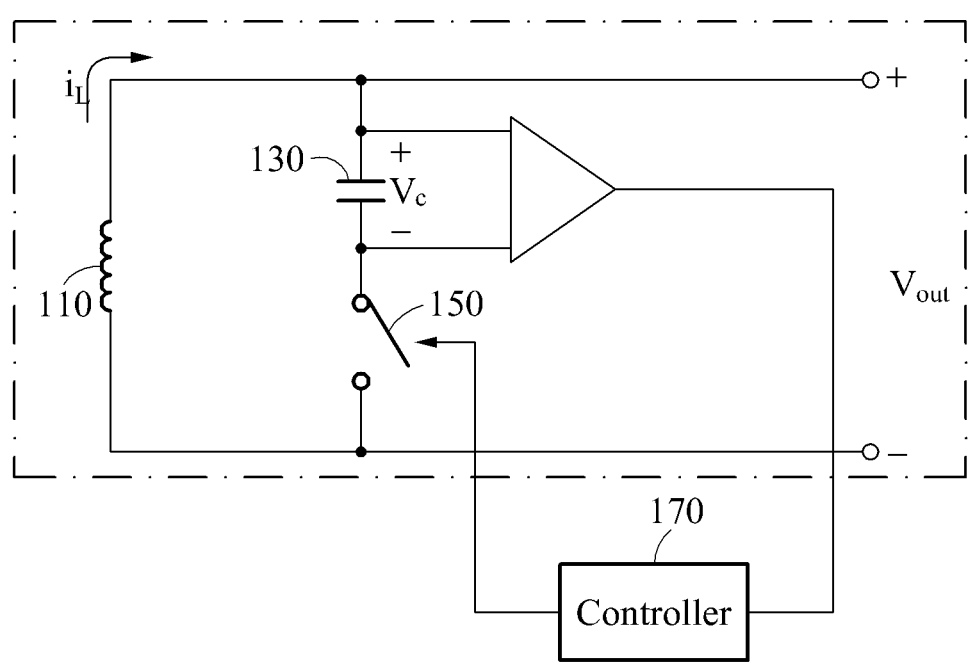
FIG. 13 illustrates an example of an operating method of a controller.

FIG. 13 illustrates an example of an operating method of a controller, such as the controller 170 of FIG. 1. Below, for convenience of explanation, the example of FIG. 13 will be explained through references to the resonator 100 of FIGS. 1 and 4A, including the inductor 110, the capacitor 130, the switch 150, and the controller 170, though such embodiments of FIG. 13 are also not limited thereto.

Referring to FIG. 13, the controller 170 controls an operating time of the switch 150 based on a value associated with the capacitor 130. For example, the controller 170 senses or measures a voltage of the capacitor 130. The controller 170 controls the operating time of the switch 150 based on a value or a magnitude of the sensed voltage.

The operating time of the switch 150 is, for example, an on-time or an off-time. For example, the switch 150 operates at half cycle intervals in accordance with the operating time.

As described above with reference to FIGS. 1 and 2, when the switch 150 is turned off, a voltage of both ends of the capacitor 130 may be maintained the same or without change during/for an energy maintenance interval. An off state of the switch 150 corresponds to an electric energy being stored in the capacitor 130 and a predetermined voltage being maintained.

During the energy maintenance interval, the controller 170 monitors energy stored in the resonator 100 by sensing or measuring a value of voltage across both ends of the capacitor 130.

The controller 170 determines or searches for an off-time of the switch 150 to enable the resonator 100 to resonate with a greater amount of energy, by adjusting the an off-time.

For example, the controller 170 determines or searches for an appropriate or optimum off-time of the switch 150 to obtain the most efficient resonance during a cycle, and controls the switch 150 based on the determined off-time.

In an example, the cycle is set based on a minimum operating time and a maximum operating time of the switch 150. In another example, the cycle is set based on a number of times the operating time of the switch 150 changes. In still another example, the cycle is set based on a predetermined period of time to control when to change the operating time of the switch 150.

As described above, a resonant frequency of the resonator 100 is controlled based on the determined off-time of the switch 150. Here, though the switch 150 may have different configurations depending on embodiment, in this example the off-time of the switch 150 of FIG. 13 corresponds to an open or lost connection being created, such as in series with the capacitor 130 and as demonstrated in FIGS. 4A or 13.

Figure 14:
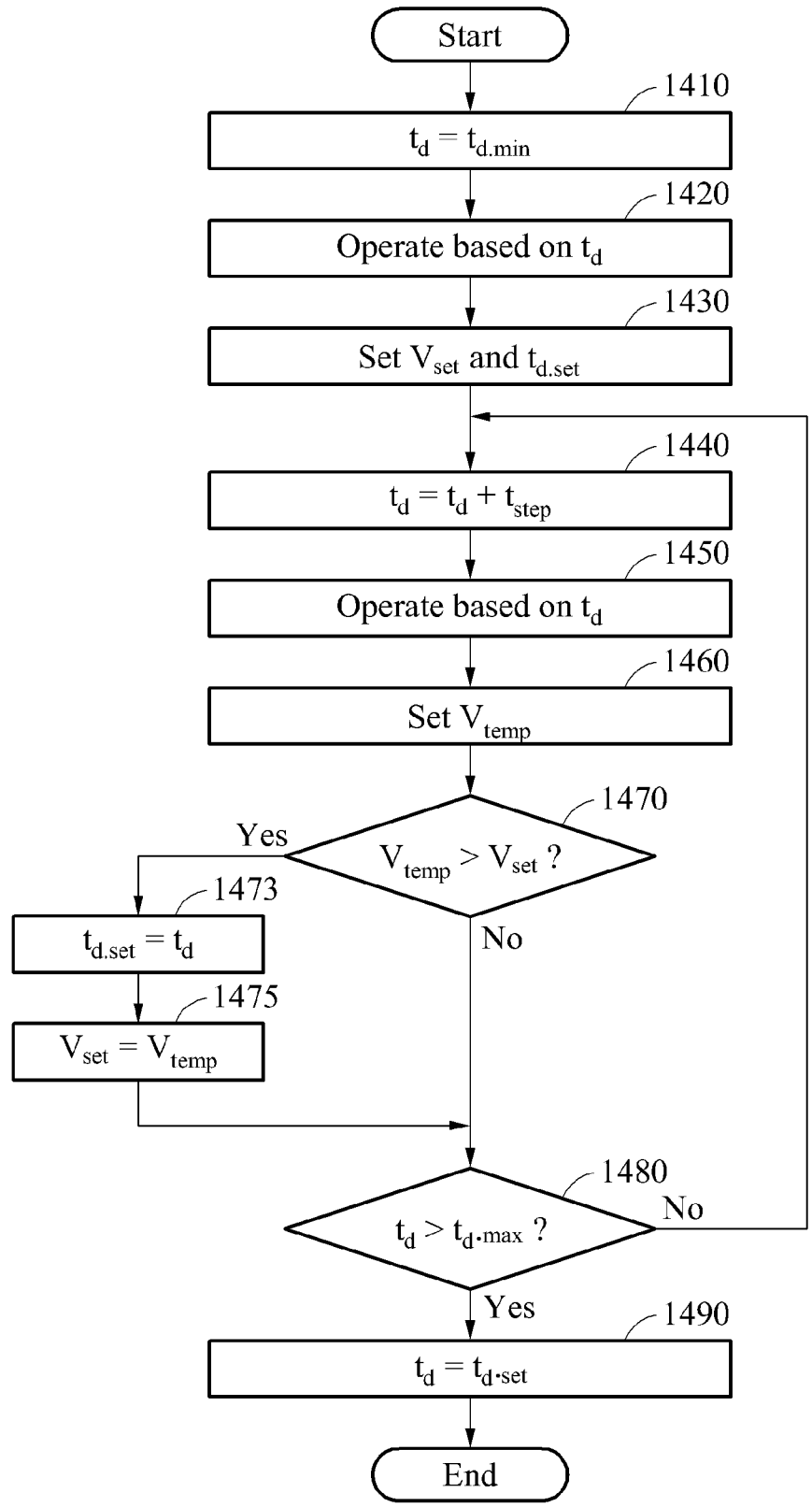
FIG. 14 illustrates example operations of a resonator method to determine an optimum resonant frequency during initial setting.

FIG. 14 illustrates example operations of a resonator method to determine an optimum resonant frequency during initial setting. Below, for convenience of explanation, the example of FIG. 14 will be explained through references to the resonator 100 of FIG. 13, though such embodiments of FIG. 14 are also not limited thereto.

Referring to FIGS. 13 and 14, when a resonant frequency of the resonator 100 of FIG. 13 is initially set, the controller 170 determines or searches for the optimum or sufficiently appropriate resonant frequency while continuously changing an operating time $t_d$ of the switch 150 from a first operating time $t_{d.min}$ to a second operating time $t_{d.max}$. Here, $t_{d.min}$ may correspond to a shorter or minimum length/period/operating time for the switch 150, while $t_{d.max}$ may correspond to a longer or maximum length/period/operating time for the switch 150. $t_{d.max}$ may also be dependent on a maximum resonant cycle T. In an example, depending on the operating time $t_d$, the switch 150 may be controlled to switch from the off-time state to the on-time state at half cycle intervals. In addition, operating time $t_d$ is, for example, an on-time or an off-time, depending on the configuration and orientation of the switch 150.

In operation 1410, the controller 170 sets the operating time $t_d$ to the first operating time $t_{d.min}$.

Thus, in operation 1420, the resonator 100 operates based on the set operating time $t_d$. In operation 1430, the controller 170 sets a resonance time $t_{d.set}$ to have the value of the first operating time $t_{d.min}$, senses or measures a value of a voltage of the capacitor 130 during the set operating time $t_d$, and sets a first voltage value $V_{set}$ to be the sensed value of the voltage. After all operations of FIG. 14 have been performed, the first voltage value $V_{set}$ may desirably be, for example, a maximum resonant voltage value corresponding to a maximum of the set resonance times $t_{d.set}$.

In operation 1440, the controller 170 increases the operating time $t_d$ to an operating time $t_d$ increased by a predetermined time $t_{step}$.

In operation 1450, the resonator 100 operates based on the increased operating time $t_d$. In operation 1460, the controller 170 senses or measures a value of a voltage of the capacitor 130 during the increased operating time $t_d$ and sets a second voltage value $V_{temp}$ to have the sensed value of the voltage. The second voltage value $V_{temp}$ may be used as, for example, a temporary voltage value.

In operation 1470, the controller 170 compares the first voltage value $V_{set}$ to the second voltage value $V_{temp}$.

When the second voltage value $V_{temp}$ is greater than the first voltage value $V_{set}$, the controller 170 sets the resonance time $t_{d.set}$ to be the increased operating time $t_d$ in operation 1473. In operation 1475, the controller 170 resets the first voltage value $V_{set}$ to have the value of the sensed or measured voltage from operation 1460.

In operation 1480, the controller 170 compares the increased operating time $t_d$ to the second operating time $t_{d.max}$.

When the increased operating time $t_d$ is greater than the second operating time $t_{d.max}$, the controller 170 determines the resonance time $t_{d.set}$ to be an optimum operating time $t_d$ of the switch 150 to be subsequently used to generate an optimum resonant frequency of the resonator 100 in operation 1490.

When the increased operating time $t_d$ is equal to or less than the second operating time $t_{d.max}$, operations 1440 through 1480 are repeatedly performed until the example incrementally increased operating time $t_d$ is greater than the second operating time $t_{d.max}$.

Accordingly, in the example of FIG. 14, the resonant frequency of the resonator 100 is determined based on the resonance time $t_{d.set}$, which is selectively updated through repetitions of operations 1440-1480 based on whether the latest sensed or measured voltage is greater than the previous largest sensed or measured voltage.

Figure 15:
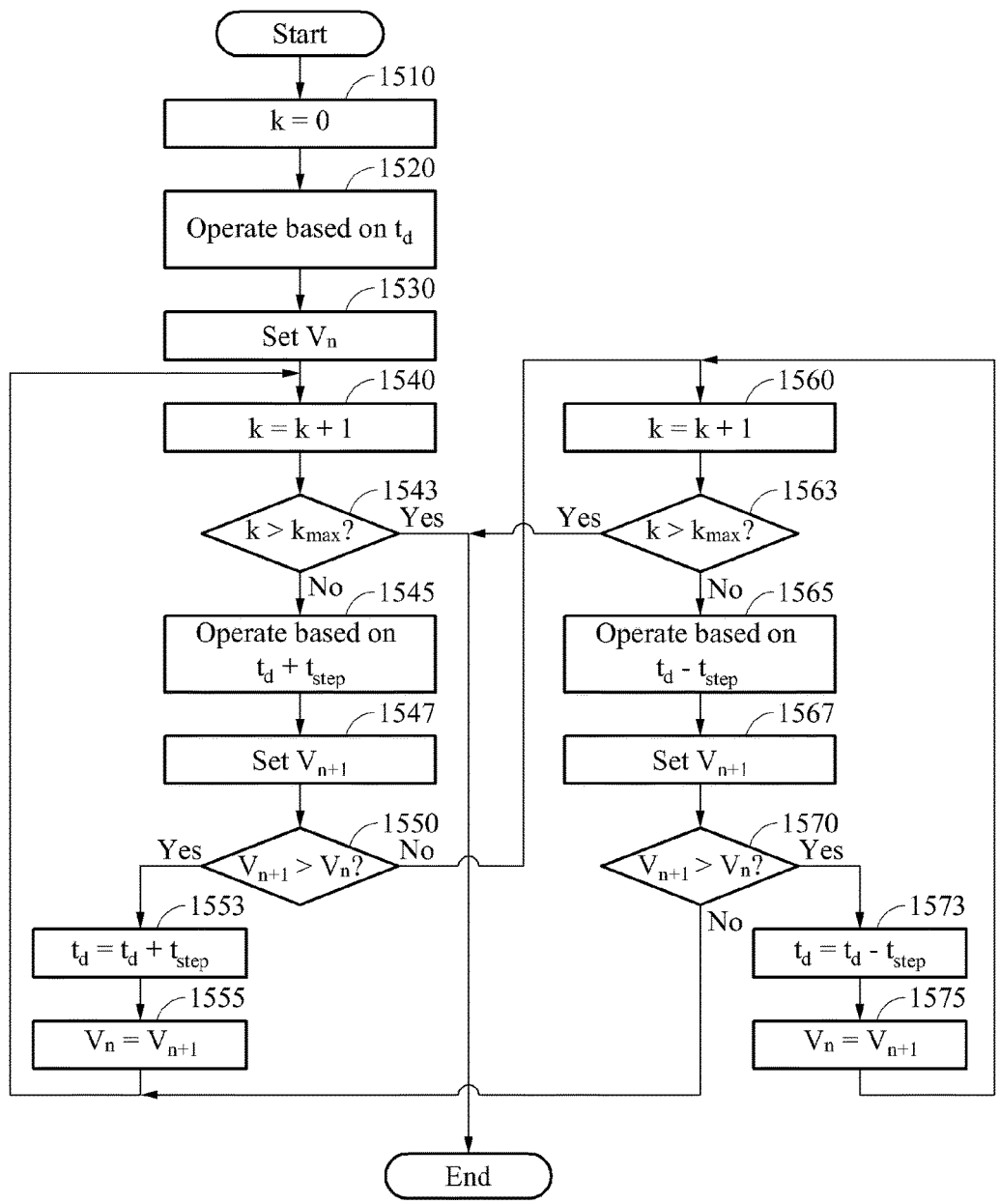
FIG. 15 illustrates example operations of a resonator method to calibrate a set resonant frequency when the resonant frequency varies.

FIG. 15 illustrates example operations of a resonator method to calibrate a set resonant frequency when the resonant frequency varies. Below, for convenience of explanation, the example of FIG. 15 will be explained through references to the resonator 100 of FIG. 13, though such embodiments of FIG. 15 are also not limited thereto.

Referring to FIGS. 13 and 15, when a currently set resonant frequency of the resonator 100 varies or is desired to vary, the controller 170 calibrates the resonant frequency while changing an operating time $t_d$ of the switch 150 by a predetermined period of time. The controller 170 calibrates the resonant frequency up to a predetermined number $k_{max}$ of times by incrementally increasing the number k each time the operating time $t_d$ is changed.

When the currently set resonant frequency varies or adjustment of the resonant frequency is desired, such as for when resonant matching with another resonator is desired for wireless power transfer, the controller 170 sets the number k to zero in operation 1510.

In operation 1520, the resonator 100 operates based on an operating time $t_d$ corresponding to the number k. In operation 1530, the controller 170 senses a value of a voltage of the capacitor 130 during the operating time $t_d$ and sets a first voltage value $V_n$ to have the sensed value of the voltage.

The controller 170 resets the number k by incrementing the number k by one in operation 1540, and compares the reset number k to the number $k_{max}$ in operation 1543.

When the reset number k is greater than the number $k_{max}$ in operation 1543, the controller 170 terminates calibrating of the resonant frequency. Here, when controller 170 terminates the calibrating, the controller 170 determines a final operating time $t_d$ corresponding to the then present (i.e., based on k) first voltage value $V_n$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1543, the resonator 100 operates based on an operating time "$t_d+t_{step}$" in operation 1545. The operating time "$t_d+t_{step}$" is obtained by adding a predetermined time $t_{step}$ to the operating time $t_d$ corresponding to the number k. For example if the number k has been incremented several times already through repetitions of operation 1540 then $t_d$ would have been incremented by $t_{step}$ several times. In operation 1547, the controller 170 senses a value of the voltage of the capacitor 130 during the operating time "$t_d+t_{step}$" and sets a second voltage value $V_n$ to be the sensed value of the voltage.

In operation 1550, the controller 170 compares the first voltage value $V_n$ to the second voltage value $V_{n+1}$.

When the second voltage value $V_{n+1}$ is greater than the first voltage value $V_n$ in operation 1550, the controller 170 resets the operating time $t_d$ to have the value of the operating time "$t_d+t_{step}$" in operation 1553, and resets the first voltage value $V_n$ to have the value of the voltage sensed in operation 1547, i.e., by resetting first voltage value $V_n$ to have the value of the second voltage value $V_n$ in operation 1555. The controller 170 then repeats operations 1540-1543 and terminates calibration if the incremented k is now greater than $k_{max}$ (operation 1543) or otherwise continues with the repetition of the remaining operations according to the flow chart beginning with operation 1545.

When the second voltage value $V_{n+1}$ is equal to or less than the first voltage value $V_n$ in operation 1550, the controller 170 resets the number k by incrementing the number k by one in operation 1560, and compares the reset number k to the number $k_{max}$ in operation 1563. In other words, the controller 170 performs operations from operation 1560 when the second voltage value $V_{n+1}$ is equal to or less than the first voltage value $V_n$ in operation 1550.

When the reset number k is greater than the number $k_{max}$ in operation 1563, the controller 170 terminates the calibrating of the resonant frequency. Here, when controller 170 terminates the calibrating, the controller 170 determines a final operating time $t_d$ corresponding to the present first voltage value $V_n$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1563, the resonator 100 operates based on an operating time "$t_d-t_{step}$" in operation 1565. The operating time "$t_d-t_{step}$" is obtained by subtracting the predetermined time $t_{step}$ from the operating time $t_d$ corresponding to the number k. In operation 1567, the controller 170 senses a value of the voltage of the capacitor 130 during the operating time "$t_d-t_{step}$" and sets the second voltage value $V_{n+1}$ to be the sensed value of the voltage.

In operation 1570, the controller 170 compares the first voltage value $V_n$ to the second voltage value $V_{n+1}$.

When the second voltage value $V_{n+1}$ is greater than the first voltage value $V_n$ in operation 1570, the controller 170 sets the operating time $t_d$ to have the value of the operating time "$t_d-t_{step}$" in operation 1573, and resets the first voltage value $V_n$ to have the value of the sensed value of the voltage from operation 1567, i.e., resets the first voltage value $V_n$ to have the value of the second voltage value $V_{n+1}$, in operation 1575. The controller 170 then repeats operations 1560-1563 and terminates calibration if the incremented k is now greater than $k_{max}$ (operation 1563) or otherwise continues with the repetition of the remaining operations according to the flow chart beginning with operation 1565.

Here, when the second voltage value $V_{n+1}$ is equal to or less than the first voltage value $V_n$ in operation 1570, the controller 170 returns to operation 1540 according to the flow chart.

Accordingly, in the example of FIG. 15, the resonant frequency of the resonator 100 is determined based on the final resonance time $t_d$ which has been selectively updated through repetitions of operations 1553 and 1573 based on whether the then latest sensed or measured voltage, e.g., in respective operations 1547 and 1567, was greater than the previous largest sensed or measured voltage. The final resonance time $t_d$ may thus represent the largest sampled voltage, and may correspond to the resonating frequency with the greatest energy.

Figure 16:
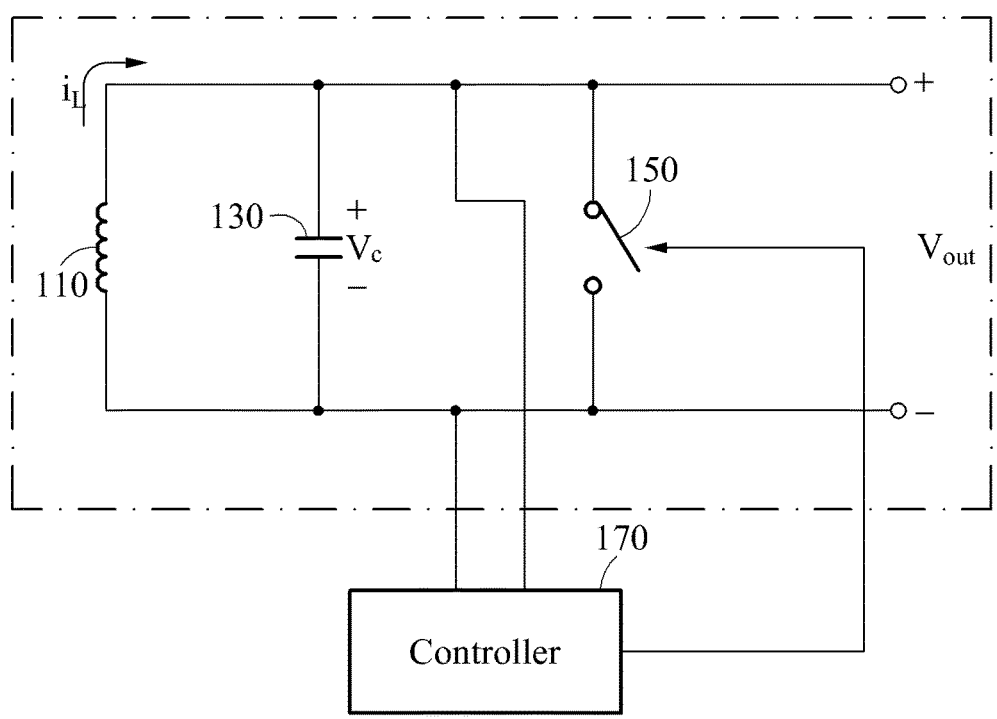
FIG. 16 illustrates an example of an operating method of a controller.

FIG. 16 illustrates an example of an operating method of a controller, such as the controller 170 of FIG. 1. Below, for convenience of explanation, the example of FIG. 16 will be explained through references to the resonator 100 of FIGS. 1 and 3A, including the inductor 110, the capacitor 130, the switch 150, and the controller 170, though such embodiments of FIG. 16 are also not limited thereto.

Referring to FIG. 16, the controller 170 controls an operating time of the switch 150 based on a value associated with the capacitor 130. For example, the controller 170 senses or measures a peak value of a voltage of the capacitor 130. The controller 170 controls the operating time of the switch 150 based on the sensed peak value or a sensed magnitude of the voltage.

The operating time of the switch 150 is, for example, an on-time or an off-time. For example, the switch 150 operates at half cycle intervals in accordance with the operating time.

As described above with reference to FIGS. 1 and 2, when the switch 150 is turned on, a current flowing in the inductor 110 may be maintained the same or without change during/for an energy maintenance interval.

During the energy maintenance interval, the controller 170 monitors energy stored in the resonator 100 by sensing or measuring a peak value of voltage across both ends of the capacitor 130.

The controller 170 determines or searches for an operating time of the switch 150 to enable the resonator 100 to resonate with a greater amount of energy, by adjusting the operating time.

For example, the controller 170 determines an optimum operating time of the switch 150 for most efficient resonance during a cycle, and controls the switch 150 based on the determined operating time.

In an example, the cycle is set based on a minimum operating time and a maximum operating time of the switch 150. In another example, the cycle is set based on a number of times the operating time of the switch 150 changes. In still another example, the cycle is set based on a predetermined period of time to control when to change the operating time of the switch 150.

As described above, a resonant frequency of the resonator 100 is controlled based on the determined operating time of the switch 150. Here, though the switch 150 may have different configurations depending on embodiment, in this example the operating time of the switch 150 of FIG. 16 corresponds to a short or connection being created, such as across the parallel inductor 110 and capacitor 130 or between the $V_{out}$ terminals in FIGS. 3A or 16.

Also, the controller 170 continues to monitor a peak of the voltage of the capacitor 130 during intervals other than the energy maintenance interval.

Figure 17:
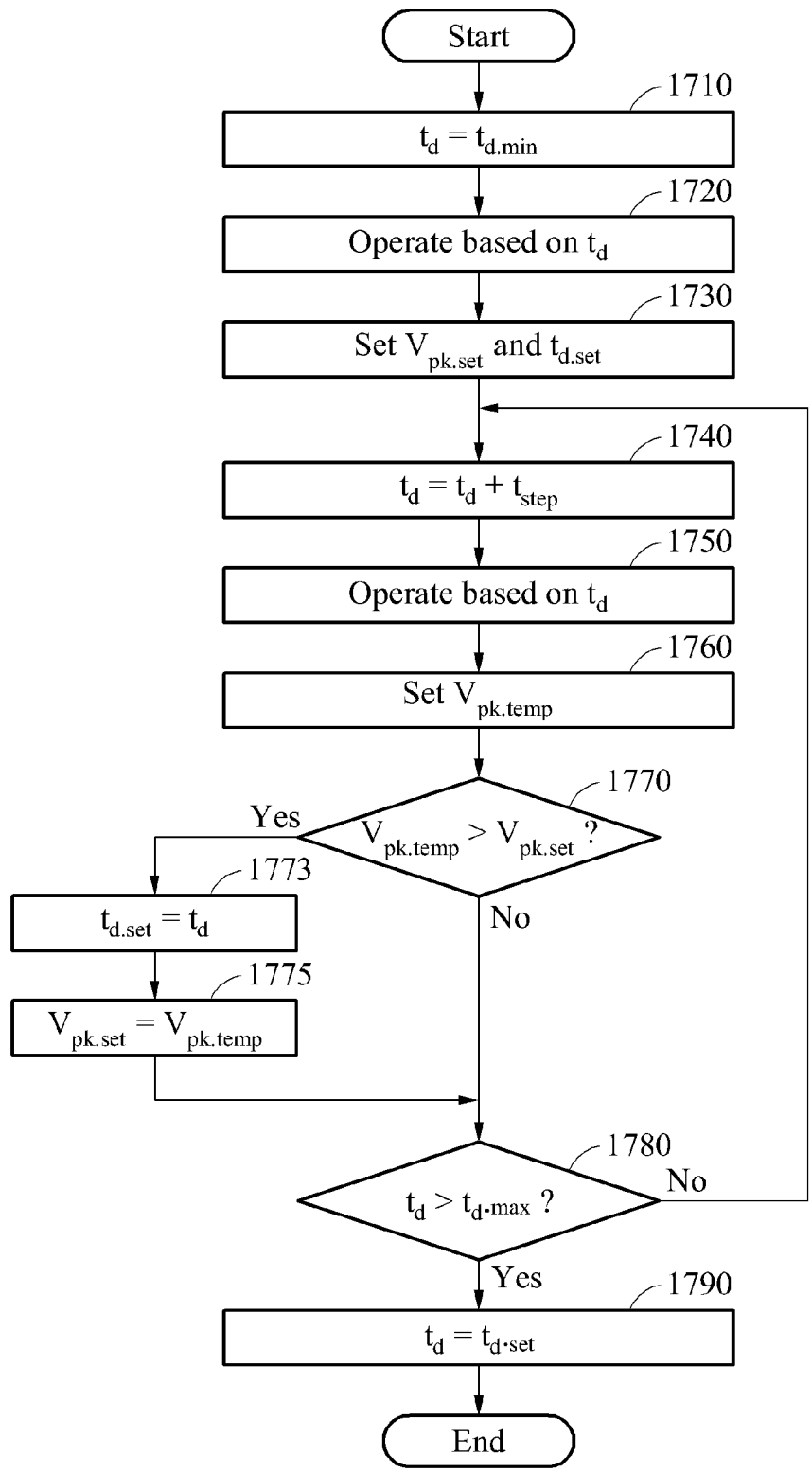
FIG. 17 illustrates example operations of a resonator method to determine an optimum resonant frequency during initial setting.

FIG. 17 illustrates example operations of a resonator method to determine an optimum resonant frequency during initial setting. Below, for convenience of explanation, the example of FIG. 17 will be explained through references to the resonator 100 of FIG. 16, though such embodiments of FIG. 17 are also not limited thereto.

Referring to FIGS. 16 and 17, when a resonant frequency of the resonator 100 of FIG. 16 is initially set, the controller 170 determines or finds the optimum or sufficiently appropriate resonant frequency while continuously changing an operating time $t_d$ of the switch 150 from a first operating time $t_{d.min}$ to a second operating time $t_{d.max}$. Here, $t_{d.min}$ may correspond to a shorter or minimum length/period/operating time for the switch 150, while $t_{d.max}$ may correspond to a longer or maximum length/period/operating time for the switch 150. $t_{d.max}$ may also be dependent on a maximum resonant cycle T. In an example, depending on the operating time $t_d$, the switch 150 may be controlled to switch from the off-time state to the on-time state at half cycle intervals. In addition, the operating time $t_d$ is, for example, an on-time or an off-time, depending on the configuration and orientation of the switch 150.

In operation 1710, the controller 170 sets the operating time $t_d$ to the first operating time $t_{d.min}$.

Thus, in operation 1720, the resonator 100 operates based on the set operating time $t_d$. In operation 1730, the controller 170 sets a resonance time $t_{d.set}$ to have the value of the first operating time $t_{d.min}$, senses or measures for a peak value of a voltage of the capacitor 130 during the set operating time $t_d$, and sets a first voltage value $V_{pk.set}$ to be the sensed peak value of the voltage. After all operations of FIG. 17 have been performed, the first voltage value $V_{pk.set}$ may desirably be, for example, a maximum resonant voltage peak value corresponding to a maximum of the set resonance times $t_{d.set}$.

In operation 1740, the controller 170 increases the operating time $t_d$ by a predetermined time $t_{step}$.

In operation 1750, the resonator 100 operates based on the increased operating time $t_d$. In operation 1760, the controller 170 senses or measures for a peak value of a voltage of the capacitor 130 during the increased operating time $t_d$ and sets a second voltage value $V_{pk.temp}$ to have the sensed peak value of the voltage. The second voltage value $V_{pk.temp}$ may be used as, for example, a temporary voltage peak value.

In operation 1770, the controller 170 compares the first voltage peak value $V_{pk.set}$ to the second voltage peak value $V_{pk.temp}$.

When the second voltage peak value $V_{pk.temp}$ is greater than the first voltage peak value $V_{pk.set}$, the controller 170 sets the resonance time $t_{d.set}$ to be the increased operating time $t_d$ in operation 1773. In operation 1775, the controller 170 resets the first voltage peak value $V_{pk.set}$ to have the value of the sensed peak value of the voltage from operation 1760.

In operation 1780, the controller 170 compares the increased operating time $t_d$ to the second operating time $t_{d.max}$.

When the increased operating time $t_d$ is greater than the second operating time $t_{d.max}$, the controller 170 determines the resonance time $t_{d.set}$ to be an optimum operating time $t_d$ for subsequent use with the switch 150 to generate an optimum resonant frequency of the resonator 100 in operation 1790.

When the increased operating time $t_d$ is equal to or less than the second operating time $t_{d.max}$, operations 1740 through 1780 are repeatedly performed until the example incrementally increased operating time $t_d$ is greater than the second operating time $t_{d.max}$.

Accordingly, in the example of FIG. 17, the resonant frequency of the resonator 100 is determined based on the resonance time $t_{d.set}$, which is selectively updated through repetitions of operations 1740-1780 based on whether the latest sensed or measured peak voltage is greater than the previous sensed or measured peak voltage.

Figure 18:
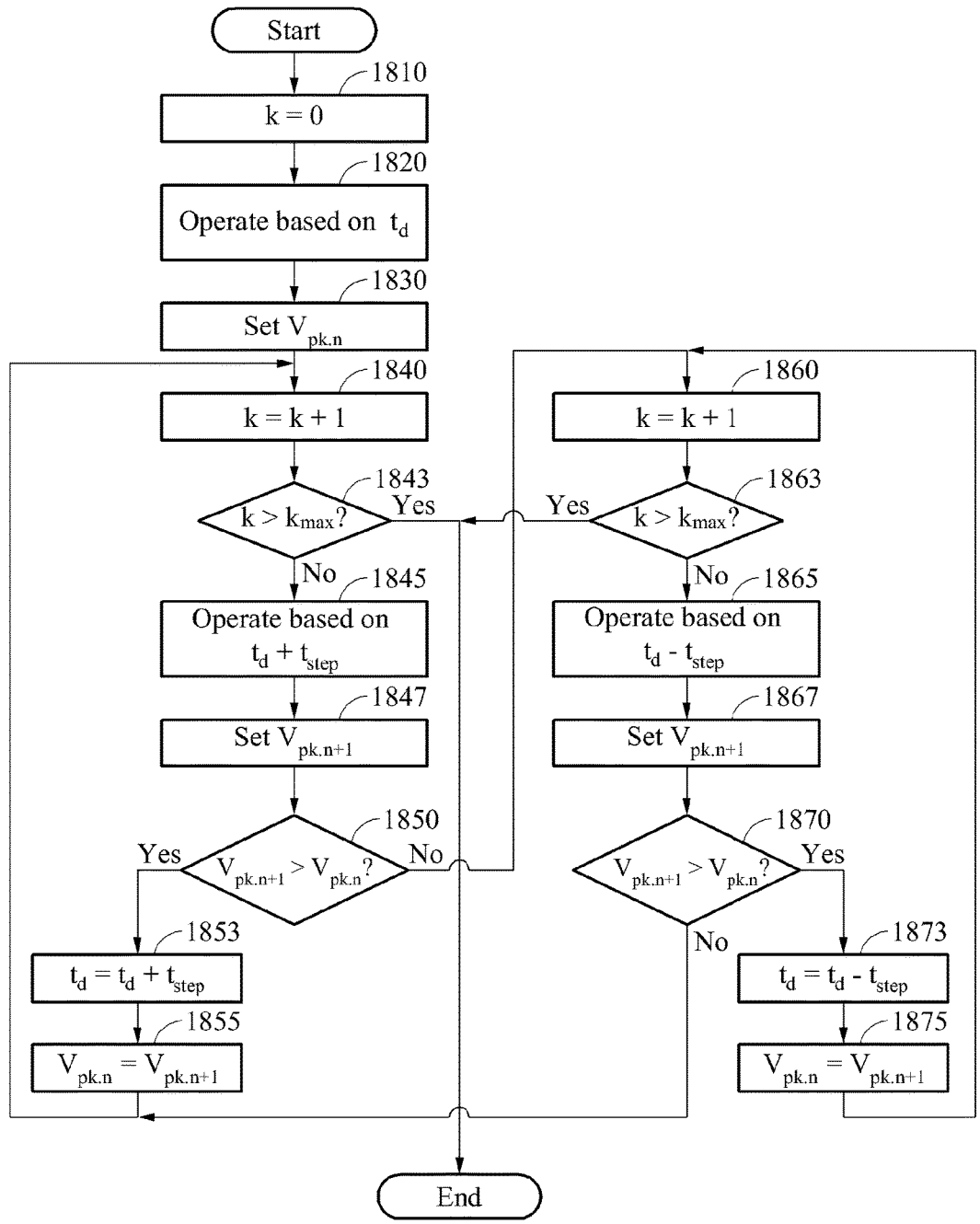
FIG. 18 illustrates example operations of a resonator method to calibrate a set resonant frequency when the resonant frequency varies.

FIG. 18 illustrates example operations of a resonator method to calibrate a set resonant frequency when the resonant frequency varies. Below, for convenience of explanation, the example of FIG. 18 will be explained through references to the resonator 100 of FIG. 16, though such embodiments of FIG. 18 are also not limited thereto.

Referring to FIGS. 16 and 18, when a currently set resonant frequency of the resonator 100 varies or is desired to vary, the controller 170 calibrates the resonant frequency while changing an operating time $t_d$ of the switch 150 by a predetermined period of time. The controller 170 calibrates the resonant frequency up to a predetermined number $k_{max}$ of times by incrementally increasing the number k each time the operating time $t_d$ is changed.

When the currently set resonant frequency varies, or adjustment of the resonant frequency is desired, such as for when resonant matching with another resonator is desired for wireless power transfer, the controller 170 sets the number k to zero in operation 1810.

In operation 1820, the resonator 100 operates based on an operating time $t_d$ corresponding to the number k. In operation 1830, the controller 170 senses a peak value of a voltage of the capacitor 130 during the operating time $t_d$ and sets a first voltage peak value $V_{pk.n}$ to have the sensed peak value of the voltage.

The controller 170 resets the number k by incrementing the number k by one in operation 1840, and compares the reset number k to the number $k_{max}$ in operation 1843.

When the reset number k is greater than the number $k_{max}$ in operation 1843, the controller 170 terminates calibrating of the resonant frequency. Here, when controller 170 terminates the calibrating, the controller 170 determines a final operating time $t_d$ corresponding to the then present (i.e., based on k) first voltage peak value $V_{pk.n}$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1843, the resonator 100 operates based on an operating time "$t_d+t_{step}$" in operation 1845. The operating time "$t_d+t_{step}$" is obtained by adding a predetermined time $t_{step}$ to the operating time $t_d$ corresponding to the number k. For example if the number k has been incremented several times already through repetitions of operation 1840 then $t_d$ would have been incremented by $t_{step}$ several times. In operation 1847, the controller 170 senses a peak value of the voltage of the capacitor 130 during the operating time "$t_d+t_{step}$" and sets a second voltage peak value $V_{pk.n+1}$ to be the sensed peak value of the voltage.

In operation 1850, the controller 170 compares the first voltage peak value $V_{pk.n}$ to the second voltage peak value $V_{pk.n+1}$.

When the second voltage peak value $V_{pk.n+1}$ is greater than the first voltage peak value $V_{pk.n}$ in operation 1850, the controller 170 resets the operating time $t_d$ to have the value of the operating time "$t_d+t_{step}$" in operation 1853, and resets the first voltage peak value $V_{pk.n}$ to have the value of the second voltage peak value $V_{pk.n+1}$ in operation 1855. The controller 170 then repeats operations 1840-1843 and terminates calibration if the incremented k is now greater than $k_{max}$ (operation 1843) or otherwise continues with the repetition of the remaining operations according to the flow chart beginning with operation 1845.

When the second voltage peak value $V_{pk.n+1}$ is equal to or less than the first voltage peak value $V_{pk.n}$ in operation 1850, the controller 170 resets the number k by incrementing the number k by one in operation 1860, and compares the reset number k to the number $k_{max}$ in operation 1863. In other words, the controller 170 performs operations from operation 1860 when the second voltage peak value $V_{pk.n+1}$ is equal to or less than the first voltage peak value $V_{pk.n}$ in operation 1250.

When the reset number k is greater than the number $k_{max}$ in operation 1863, the controller 170 terminates the calibrating of the resonant frequency. Here, when controller 170 terminates the calibrating, the controller 170 determines a final operating time $t_d$ corresponding to the present first voltage peak value $V_{pk.n}$ as the appropriate operating time of the switch 150 to generate an optimum resonant frequency of the resonator 100, and calibrates the resonant frequency of the resonator 100 based on the determined operating time $t_d$.

When the reset number k is equal to or less than the number $k_{max}$ in operation 1863, the resonator 100 operates based on an operating time "$t_d-t_{step}$" in operation 1865. The operating time "$t_d-t_{step}$" is obtained by subtracting the predetermined time $t_{step}$ from the operating time $t_d$ corresponding to the number k. In operation 1867, the controller 170 senses a peak value of the voltage of the capacitor 130 during the operating time "$t_d-t_{step}$" and sets the second voltage peak value $V_{pk.n+1}$ to be the sensed peak value.

In operation 1870, the controller 170 compares the first voltage peak value $V_{pk.n}$ to the second voltage peak value $V_{pk.n+1}$.

When the second voltage peak value $V_{pk.n+1}$ is greater than the first voltage peak value $V_{pk.n}$ in operation 1870, the controller 170 sets the operating time $t_d$ to have the value of the operating time "$t_d-t_{step}$" in operation 1873, and resets the first voltage peak value $V_{pk.n}$ to have the value of the sensed peak of the voltage from operation 1867, i.e., resets first voltage peak value $V_{pk.n}$ to have the value of the second voltage peak value $V_{pk.n+1}$, in operation 1875. The controller 170 then repeats operations 1860-1863 and terminates calibration if the incremented k is now greater than $k_{max}$ (operation 1863) or otherwise continues with the repetition of the remaining operations according to the flow chart beginning with operation 1865.

Here, when the second voltage peak value $V_{pk.n+1}$ is equal to or less than the first voltage peak value $V_{pk.n}$ in operation 1870, the controller 170 returns to operation 1840 according to the flow chart.

Accordingly, in the example of FIG. 18, the resonant frequency of the resonator 100 is determined based on the final resonance time $t_d$ which has been selectively updated through repetitions of operations 1853 and 1873 based on whether the then latest sensed or measured peak voltage, e.g., in respective operations 1847 and 1867, was greater than the previous largest sensed or measured peak voltage. The final resonance time $t_d$ may thus represent the largest sampled voltage, and may correspond to the resonating frequency with the greatest energy.

Figure 19:
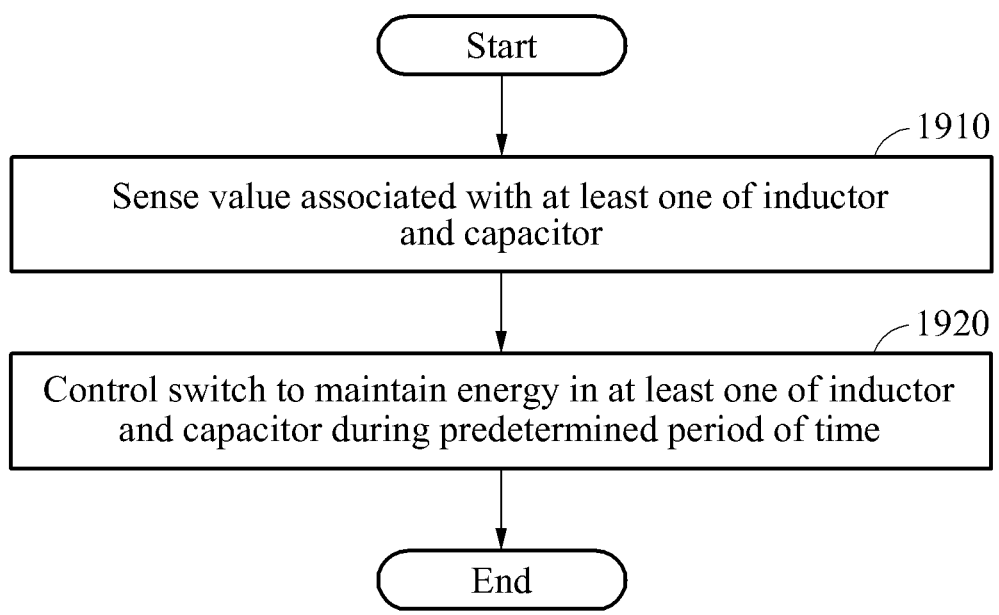
FIG. 19 illustrates an example of a resonator method.

FIG. 19 illustrates example operations of a resonator method. Below, for convenience of explanation, the example of FIG. 19 will be explained through references to the resonator 100 of FIG. 1, including the inductor 110, the capacitor 130, the switch 150, and the controller 170, though such embodiments of FIG. 19 are also not limited thereto.

Referring to FIG. 19, in operation 1910, the controller 170 senses a value associated with at least one of the inductor 110 and the capacitor 130.

In operation 1920, the controller 170 controls an operation of the switch 150 to maintain energy in the at least one of the inductor 110 and the capacitor 130 during/for a predetermined period of time, based on the sensed value. Herein, the controller 170 may include one or more processing devices, or other hardware control elements, configured to operate as described in any of the above methods to control resonance of a corresponding LC circuit.

The apparatuses, units, modules, devices, and other components illustrated in FIGS. 1, 3A, 4A, 5-10, 13 and 16 that perform the operations described herein with respect to FIGS. 2B, 11, 12, 14, 15, 17, 18 and 19 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more hardware processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 11, 12, 14, 15, 17, 18 and 19. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as processor or computer readable code or programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resonator comprising:
an inductor;
a capacitor;
a switch configured to maintain energy in at least one of the inductor and the capacitor for a select period of time and to enable variability of energy in the at least one of the inductor and the capacitor for another period of time, to set a resonating frequency of the inductor and the capacitor; and a controller configured to control the switch to set the resonating frequency based on values of energy characteristics of the at least one of the inductor and the capacitor, wherein the controller is configured to perform the control of the switch to sense the values of the energy characteristics of the at least one of the inductor and the capacitor with respect to a changing of operating time extents of the switch from at least a first operating time extent to a second operating time extent, and to set the resonating frequency with the select period of time being an operating time extent, among the changed operating time extents of the switch, determined to maintain energy characteristic values of the at least one of the inductor and the capacitor at a maximum value among the sensed values of the energy characteristics of the at least one of the inductor and the capacitor.

2. The resonator of claim 1, wherein the select period of time is selected from among varying periods of time, which the switch is configured to respectively maintain energy in the at least one of the inductor and the capacitor, that variably implement respective resonating frequencies of the inductor and the capacitor.

3. The resonator of claim 2, wherein the switch selectively operates according to the select period of time and the other period of time based upon a control signal from the controller, such that the control signal from the controller implementing the select period of time represents that the select period of time, selected from among the varying periods of time, has been determined by the controller to be a period of time that maximizes a resonance matching of an LC circuit, which includes the inductor and the capacitor, of the resonator and another LC circuit of an exterior resonator that is implementing a wireless power transfer operation between the other LC circuit and the LC circuit of the resonator.

4. The resonator of claim 2, wherein the capacitor has a fixed capacitance and the inductor has a fixed inductance, and the capacitor and inductor are configured to generate plural resonating frequencies depending on which of the varying periods of time is the select period of time.

5. The resonator of claim 1, wherein the switch operates for a first period of time to perform a calibrating maintenance of energy in the at least one of the inductor and the capacitor and a second period of time to not perform the calibrating maintenance of the energy in a second period of time, in response to a control signal provided by the controller that generates the control signal to calibrate the set resonating frequency.

6. The resonator of claim 1, wherein the switch is connected in parallel with the inductor.

7. The resonator of claim 1, wherein the switch is connected in series with the capacitor.

8. The resonator of claim 1, wherein the inductor and the capacitor are connected in parallel.

9. The resonator of claim 1, wherein the inductor and the capacitor are connected in series.

10. The resonator of claim 1, wherein the capacitor is a parasitic capacitor of the inductor.

11. The resonator of claim 10, wherein an LC circuit, including the inductor without an additional capacitor, generates the set resonating frequency.

12. The resonator of claim 1, wherein the resonator is a mobile electronic device and further comprises the controller, and wherein the switch is a backscattering switch of an LC circuit including the inductor and the capacitor.

13. The resonator of claim 1, wherein the controller is configured to sense the values the energy characteristics of the at least one of the inductor and the capacitor while incrementally changing operating time extents of the switch up to a predetermined number of time.

14. The resonator of claim 1, wherein the sensed values of the energy characteristics of the at least one of the inductor and the capacitor comprises at least one of a value for a sensed current of the inductor and a value of a sensed voltage for the capacitor.

15. The resonator of claim 1, wherein the resonator is an electronic device configured to provide wireless power and/or receive wireless power using an LC resonator, including the inductor and the capacitor, configured to variably resonate dependent on selective activation of the switch as controlled by the controller.

16. A resonator comprising:
an inductor;
a capacitor;
a switch configured to maintain energy in at least one of the inductor and the capacitor for a select period of time and to enable variability of energy in the at least one of the inductor and the capacitor for another period of time, to set a resonating frequency of the inductor and the capacitor; and
a controller configured to control the switch to set the resonating frequency based on values of energy characteristics of the at least one of the inductor and the capacitor,
wherein the controller is configured to perform the control of the switch to maintain the values of the energy characteristics of the at least one of the inductor and the capacitor at a maximum value among the values of the energy characteristics of the at least one of the inductor and the capacitor,
wherein the switch selectively operates according to the select period of time and the other period of time based upon a control signal from the controller, such that the control signal from the controller implementing the select period of time represents that the select period of time, selected from among the varying periods of time, has been determined by the controller to be a period of time that maximizes a resonance matching of an LC circuit, which includes the inductor and the capacitor, of the resonator and another LC circuit of an exterior resonator that is implementing a wireless power transfer operation between the other LC circuit and the LC circuit of the resonator, and
wherein the resonator is a mobile electronic device and further comprises the controller, and wherein the switch is a backscattering switch of the LC circuit of the resonator.

17. A resonator comprising:
an inductor;
a capacitor;
a switch configured to maintain energy in at least one of the inductor and the capacitor for a select period of time and to enable variability of energy in the at least one of the inductor and the capacitor for another period of time, to set a resonating frequency of the inductor and the capacitor; and a controller configured to control the switch to set the resonating frequency based on values of energy characteristics of the at least one of the inductor and the capacitor, wherein the controller is configured to perform the control of the switch to maintain the values of the energy characteristics of the at least one of the inductor and the capacitor at a maximum value among the values of the energy characteristics of the at least one of the inductor and the capacitor, wherein the switch is a first switch connected in parallel with the inductor and configured to maintain an energy in the inductor for a first select period of time, and wherein the resonator further comprises a second switch connected in series with the capacitor and configured to maintain an energy in the capacitor for a second select period of time.

18. The resonator of claim 17, wherein the first select period of time is synchronous with the second select period of time, and during the first switch being controlled open the second switch is closed and during the first switch being controlled closed the second switch is open.

19. A resonator method, the method comprising:

controlling operation of a resonator, to set a resonating frequency of an inductor and a capacitor of the resonator, between at least a maintaining of energy in at least one of the inductor and the capacitor for a select period of time and an enabling of variability of energy in the at least one of the inductor and the capacitor for another period of time; and controlling a switch to set the resonating frequency based on values of energy characteristics of the at least one of the inductor and the capacitor, wherein the controlling of the switch comprises sensing the values of the energy characteristics of the at least one of the inductor and the capacitor with respect to a changing of operating time extents of the switch from at least a first operating time extent to a second operating time extent, and setting the resonating frequency with the select period of time as an operating time extent, among the changed operating time extents of the switch, determined as maintaining energy characteristic values of the at least one of the inductor and the capacitor at a maximum value among the sensed values of the energy characteristics of the at least one of the inductor and the capacitor.

20. The method of claim 19, wherein the controlling of the operation of the resonator between the maintaining of energy and enabling of variability of energy includes respectively implementing the maintaining of energy and the enabling of variability of energy through alternate operations of the switch.

21. The method of claim 20, wherein the sensing comprises sensing the values of the energy characteristics of the at least one of the inductor and the capacitor while changing operating time extents of the switch from a first operating time extent to a second operating time extent.

22. The method of claim 20, wherein the sensing comprises sensing the values of the energy characteristics of the at least one of the inductor and the capacitor while incrementally changing operating time extents of the switch up to a predetermined number of time.

23. The method of claim 20, wherein the sensed values of the energy characteristics of the at least one of the inductor and the capacitor comprises at least one of a value of a sensed current for the inductor and a value of a sensed voltage for the capacitor.

24. The method of claim 20, wherein the controlling of the operation of the resonator to set the resonating frequency is based on the switch being connected in parallel with the inductor.

25. The method of claim 20, wherein the controlling of the operation of the resonator to set the resonating frequency is based on the switch being connected in series with the capacitor.

26. The method of claim 19, wherein the controlling of the operation of the resonator to set the resonating frequency is based on the inductor and the capacitor being connected in parallel.

27. The method of claim 19, wherein the controlling of the operation of the resonator to set the resonating frequency is based on the inductor and the capacitor being connected in series.

28. The method of claim 19, wherein the controlling of the operation of the resonator to set the resonating frequency is based on the capacitor being a parasitic capacitor of the inductor.

29. A non-transitory processor readable medium comprising processor readable code to control one or more processing devices to implement the method of claim 19.

30. A resonator method, the method comprising:

controlling operation of a resonator, to set a resonating frequency of an inductor and a capacitor of the resonator, between at least a maintaining of energy in at least one of the inductor and the capacitor for a select period of time and an enabling of variability of energy in the at least one of the inductor and the capacitor for another period of time; and controlling a switch to set the resonating frequency based on values of energy characteristics of the at least one of the inductor and the capacitor, wherein the controlling of the switch comprises maintaining the values of the energy characteristics of the at least one of the inductor and the capacitor at a maximum value among the values of the energy characteristics of the at least one of the inductor and the capacitor, and wherein the controlling of the operation of the resonator to set the resonating frequency includes controlling a first switch connected in parallel with the inductor and to maintain an energy in the inductor for a first select period of time, and controlling a second switch connected in series with the capacitor and to maintain an energy in the capacitor for a second select period of time.

31. A resonator comprising:

an LC circuit having a fixed inductance and capacitance;

a resonating frequency controlling circuit configured to selectively maintain energy without change in a portion of the LC circuit for various select periods of time to set respective resonating frequencies of the LC circuit, wherein the resonating frequency controlling circuit is configured to control a switch to set the resonating frequency based on sensed values of energy characteristics of the at least one of the inductor and the capacitor for different operating time extents of the switch, where the controlling of the switch includes controlling the switch to set the resonating frequency with one of the various select periods of time being an operating time extent, among the different operating time extents of the switch, determined to maintain energy characteristic values of the at least one of the inductor and the capacitor at a determined maximum value among the sensed values of the energy characteristics of the at least one of the inductor and the capacitor.

32. The resonator of claim 31, wherein the LC circuit includes an inductor with the fixed inductance and a capacitor with the fixed capacitance.

33. The resonator of claim 31, wherein the LC circuit includes an inductor with the fixed inductance and the fixed capacitance.

34. The resonator of claim 31, wherein the resonating frequency controlling circuit includes a controller configured to determine a calibrated period of time, from the various select periods of time, to set a calibrated frequency of the LC circuit with a maximum energy level in the LC circuit compared to energy levels that would be provided by remaining select periods of time of the various select periods of time.

* * * * *